US012563884B2

(12) United States Patent
Baek et al.

(10) Patent No.: US 12,563,884 B2
(45) Date of Patent: Feb. 24, 2026

(54) ORGANIC LIGHT EMITTING DIODE AND ORGANIC LIGHT EMITTING DEVICE HAVING THE DIODE

(71) Applicant: LG DISPLAY CO., LTD., Seoul (KR)

(72) Inventors: Jeong-Eun Baek, Paju-si (KR); Jun-Yun Kim, Paju-si (KR); Tae-Ryang Hong, Paju-si (KR); Ji-Ae Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 546 days.

(21) Appl. No.: 17/011,581

(22) Filed: Sep. 3, 2020

(65) Prior Publication Data

US 2021/0066636 A1 Mar. 4, 2021

(30) Foreign Application Priority Data

Sep. 4, 2019 (KR) ........................ 10-2019-0109451

(51) Int. Cl.
*H10K 50/11* (2023.01)
*C09K 11/06* (2006.01)
(Continued)

(52) U.S. Cl.
CPC ......... *H10K 50/11* (2023.02); *H10K 85/6572* (2023.02); *C09K 11/06* (2013.01);
(Continued)

(58) Field of Classification Search
CPC ............ C09K 11/06; C09K 2211/1014; H01L 51/0067; H01L 51/0071; H01L 51/0072;
(Continued)

(56) References Cited

U.S. PATENT DOCUMENTS

2003/0189401 A1* 10/2003 Kido ...................... H10K 50/17 313/506
2015/0105564 A1* 4/2015 Adachi ................ C07D 209/08 548/440
(Continued)

FOREIGN PATENT DOCUMENTS

JP 2008127326 A * 6/2008
JP 2016167441 A 9/2016
(Continued)

OTHER PUBLICATIONS

KR-2018035528-A machine translation (Year: 2018).*
JP-2008127326-A machine translation (Year: 2008).*
Yoo et al. Dyes and Pigments 128 (2016) 201-208 (Year: 2016).*
Office Action issued in corresponding Korean Patent Application No. 10-2019-0109451, dated Nov. 6, 2023.
First Office Action dated Jul. 24, 2023, issued in corresponding Chinese Patent Application No. 202010914943.0.

*Primary Examiner* — Elizabeth M. Dahlburg
(74) *Attorney, Agent, or Firm* — Morgan, Lewis & Bockius LLP

(57) ABSTRACT

The present disclosure relates to an organic light emitting diode and an organic light emitting device having the diode. An organic light emitting diode including a plurality of delayed fluorescent materials with specific energy levels and an organic light emitting device including the diode is disclosed. When the plurality of delayed fluorescent materials with specific energy levels are applied in an emitting material layer, it is possible to minimize the energy loss or exciton quenching during luminescent process, to prevent the diode from reducing lifetime caused by the exciton quenching, and to make charges being injected into the emitting material layer in balance. When the emitting material layer includes other luminous material having a narrow FWHM, the organic light emitting diode can enhance its color purity.

14 Claims, 17 Drawing Sheets

(51) Int. Cl.

| | |
|---|---|
| ***H10K 85/60*** | (2023.01) |
| ***H10K 101/20*** | (2023.01) |
| ***H10K 101/40*** | (2023.01) |

(52) U.S. Cl.

CPC .... *C09K 2211/1014* (2013.01); *H10K 85/654* (2023.02); *H10K 2101/20* (2023.02); *H10K 2101/40* (2023.02)

(58) Field of Classification Search

CPC ............. H01L 51/5012; H01L 51/5024; H01L 51/5028; H01L 51/504; H01L 2251/55; H01L 2251/552; H10K 50/11; H10K 50/12; H10K 50/121; H10K 50/13; H10K 85/654; H10K 85/657; H10K 85/6572; H10K 2101/10; H10K 2101/20; H10K 2101/30; H10K 2101/40; H10K 59/12

See application file for complete search history.

(56) References Cited

U.S. PATENT DOCUMENTS

| | | | | |
|---|---|---|---|---|
| 2016/0190478 | A1* | 6/2016 | Nakanotani .......... | H10K 85/654 257/40 |
| 2017/0263871 | A1* | 9/2017 | Wang ................... | C07D 221/20 |
| 2018/0047926 | A1 | 2/2018 | Tanaka et al. | |
| 2018/0090705 | A1 | 3/2018 | Kim et al. | |
| 2018/0323394 | A1* | 11/2018 | Haldi ..................... | H10K 50/82 |
| 2018/0323395 | A1* | 11/2018 | Haldi ................. | H10K 85/6572 |
| 2019/0013481 | A1* | 1/2019 | Nasu ...................... | C09K 11/06 |

FOREIGN PATENT DOCUMENTS

| | | | | | |
|---|---|---|---|---|---|
| KR | 10-2018-0035528 | A | | 4/2018 | |
| KR | 2018035528 | A | * | 4/2018 | ............. C09K 11/06 |
| WO | WO-2016111196 | A1 | * | 7/2016 | ........... C07D 219/14 |

* cited by examiner

ORGANIC LIGHT EMITTING DIODE AND ORGANIC LIGHT EMITTING DEVICE HAVING THE DIODE

CROSS-REFERENCE TO RELATED APPLICATIONS

This application claims the benefit under 35 U.S.C. § 119(a) of Korean Patent Application No. 10-2019-0109451, filed in the Republic of Korea on Sep. 4, 2019, which is incorporated herein by reference in its entirety.

BACKGROUND

Technical Field

The present disclosure relates to an organic light emitting diode, and more specifically, to an organic light emitting diode having enhanced luminous efficiency and lifetime and an organic light emitting device having the diode.

Discussion of the Related Art

As display devices have become larger, there exists a need for a flat display device with lower spacing occupation. Among the flat display devices, a display device using an organic light emitting diode (OLED) has come into the spotlight.

The OLED can be formed even on a flexible transparent substrate such as a plastic substrate. In addition, the OLED can be driven at a lower voltage of 10 V or less. Besides, the OLED has relatively lower power consumption for driving compared to plasma display panel and inorganic electroluminescent devices, and color purity thereof is very high. Further, since the OLED can display various colors such as green, blue, red and the like, the OLED display device has attracted a lot of attention as a next-generation display device that express fluent colors.

In the OLED, when electrical charges are injected into an emitting material layer between an electron injection electrode (i.e., cathode) and a hole injection electrode (i.e., anode), electrical charges are combined to be paired, and then emit light as the combined electrical charges are disappeared. In other words, holes injected from the anode and electrons injected from the cathode recombine in the emitting material layer to form unstable excited state exciton, and then the exciton returns to a stable ground state with luminescence.

Only singlet exciton participate in the luminescence process and the rest 75% triplet exciton cannot participate in the luminescence process in fluorescent materials, the OLED using the conventional fluorescent materials shows the maximal luminance efficiency of about 5%. On the other hand, phosphorescent material has a luminescent mechanism of converting both the singlet exciton and the triplet exciton into light. In the phosphorescent material, the singlet exciton can be converted to the triplet exciton via intersystem crossing (ISC). When the OLED comprising the phosphorescent material that can utilize both the singlet and triplet excitons, it can enhance its luminous efficiency compared to using the fluorescent material. However, the OLED to which blue phosphorescent material is used has showed too low color purity and unsatisfactory lifetime to be applied into commercial display device.

SUMMARY

Accordingly, embodiments of the present disclosure are directed to an OLED and an organic light emitting device including the OLED that substantially obviates one or more of the problems due to the limitations and disadvantages of the related art.

An aspect of the present disclosure is to provide an OLED that can enhance its luminous efficiency and lifetime and an organic light emitting device including the diode.

Another aspect of the present disclosure is to provide an OLED having improved color purity and an organic light emitting device including the diode.

Additional features and aspects will be set forth in the description that follows, and in part will be apparent from the description, or may be learned by practice of the inventive concepts provided herein. Other features and aspects of the inventive concept may be realized and attained by the structure particularly pointed out in the written description, or derivable therefrom, and the claims hereof as well as the appended drawings.

To achieve these and other aspects of the inventive concepts, as embodied and broadly described, an OLED comprises a first electrode; a second electrode facing the first electrode; and at least one emitting unit disposed between the first electrode and the second electrode, wherein the at least one emitting unit comprises a first emitting material layer, wherein the first emitting material layer comprises a first host, a first delayed fluorescent material and a second delayed fluorescent material, wherein an excited triplet energy level ($T_1^{DF1}$) of the first delayed fluorescent material and an excited triplet energy level ($T_1^{DF2}$) of the second delayed fluorescent material satisfy the following relationship in Equation (1), wherein a lowest unoccupied molecular orbital (LUMO) energy level ($LUMO^{DF1}$) of the first delayed fluorescent material and a LUMO energy level ($LUMO^{DF2}$) of the second delayed fluorescent material satisfy the following relationship in Equation (3), and wherein each of an excited singlet energy level ($S_1^H$) and an excited triplet energy level ($T_1^H$) of the first host is higher than each of an excited singlet energy level ($S_1^{DF1}$) and the excited triplet energy level ($T_1^{DF1}$) of the first delayed fluorescent material, respectively:

$$T_1^{DF2} > T_1^{DF1} \quad (1)$$

$$LUMO^{DF2} - LUMO^{DF1} \leq 0.3 \text{ eV} \quad (3).$$

In another aspect, an OLED comprises a first electrode; a second electrode facing the first electrode; and at least one emitting unit disposed between the first electrode and the second electrode, wherein the at least one emitting unit comprises a first emitting material layer, wherein the first emitting material layer comprises a first host, a first delayed fluorescent material and a second delayed fluorescent material, and wherein the first delayed fluorescent material comprises an organic compound having the following structure of Chemical Formula 1, and the second delayed fluorescent material comprises an organic compound having the following structure of Chemical Formula 2

[Chemical Formula 1]

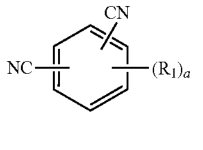

-continued

[Chemical Formula 2]

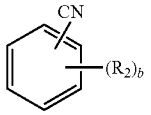

wherein each of $R_1$ and $R_2$ is independently selected from the group consisting of hydrogen, deuterium, $C_1$-$C_{20}$ alkyl, $C_6$-$C_{30}$ aryl and hetero aryl selected from carbazolyl and acridinyl, wherein the $C_6$-$C_{30}$ aryl is unsubstituted or substituted with $C_1$-$C_{10}$ alkyl, and wherein the hetero aryl is unsubstituted or substituted with at least one of $C_1$-$C_{10}$ alkyl, $C_6$-$C_{30}$ aryl, carbazolyl and acridinyl, or two adjacent groups among $R_1$ or $R_2$ form a fused ring or a spiro structure; each of a and b is a number of substituent, a is an integer of 0 (zero) to 3 and b is an integer of 0 (zero) to 4.

In still another aspect, an organic light emitting device comprises a substrate and the OLEDs disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

[Organic Light Emitting Device]

Figure 1:
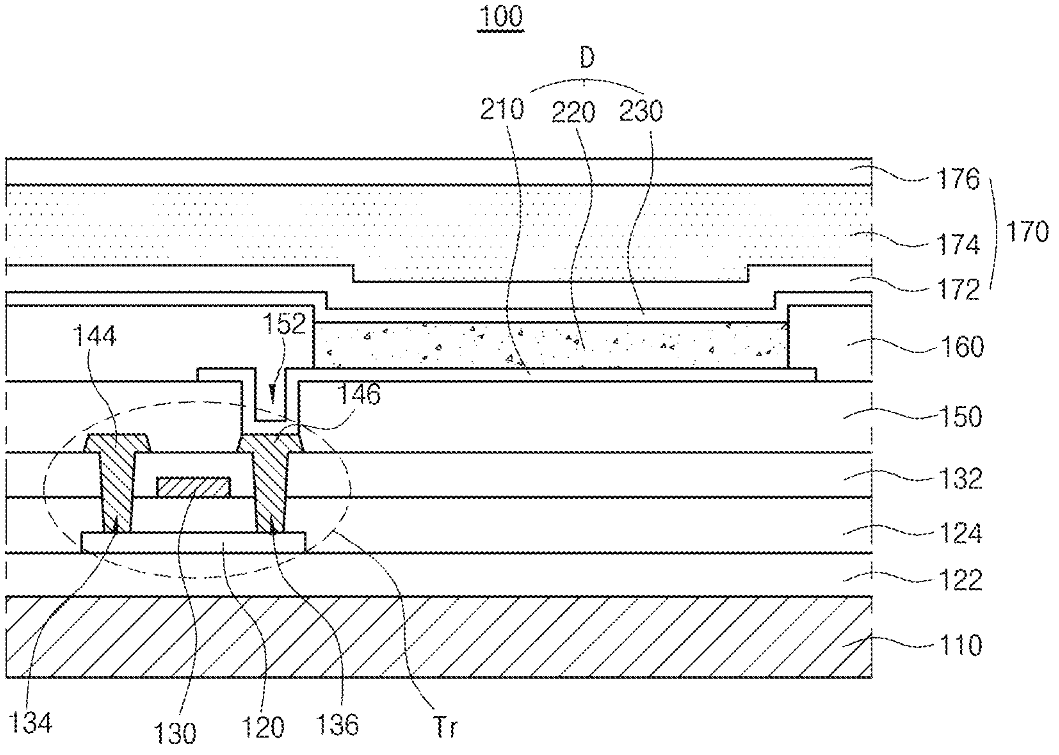
FIG. 1 is a schematic cross-sectional view illustrating an organic light emitting display device of the present disclosure.

An OLED of the present disclosure includes a plurality of delayed fluorescent materials in an emitting material layer so as to enhance its luminous efficiency, its lifetime and its color purity. The OLED of the present disclosure may be applied to an organic light emitting device such as an organic light emitting display device and an organic light emitting illumination device. A display device including the OLED will be explained. FIG. 1 is a schematic cross-sectional view of an organic light emitting display device of the present disclosure.

As illustrated in FIG. 1, the organic light emitting display device 100 includes a substrate 110, a thin-film transistor Tr on the substrate 110, and an organic light emitting diode (OLED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the OLED D are arranged, form an array substrate.

A buffer layer 122 may be disposed over the substrate 110, and the thin film transistor Tr is disposed over the buffer layer 120. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shield pattern may be disposed under the semiconductor layer 120, and the light-shield pattern can prevent light from being incident toward the semiconductor layer 120, and thereby, preventing the semiconductor layer 120 from being deteriorated by the light. Alternatively, the semiconductor layer 120 may include, but is not limited to, polycrystalline silicon. In this case, opposite edges of the semiconductor layer 120 may be doped with impurities.

A gate insulating layer 124 formed of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 formed of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over opposite sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, which are formed of a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and a source and drain electrodes are disposed over the semiconductor layer. In this case, the semiconductor layer may comprise amorphous silicon.

A gate line and a data line, which cross each other to define a pixel region, and a switching element, which is connected to the gate line and the data line is, may be further formed in the pixel region of FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter that comprises dyes or pigments for transmitting specific wavelength light of light emitted from the OLED D. For example, the color filter can transmit light of specific wavelength such as red (R), green (G), blue (B) and/or white (W). Each of red, green, and blue color filter may be formed separately in each pixel region. In this case, the organic light emitting display device 100 can implement full-color through the color filter.

For example, when the organic light emitting display device 100 is a bottom-emission type, the color filter may be disposed on the interlayer insulating layer 132 with corresponding to the OLED D. Alternatively, when the organic light emitting display device 100 is a top-emission type, the color filter may be disposed over the OLED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The OLED D includes a first electrode 210 that is disposed on the passivation layer 150 and connected to the drain electrode 146 of the thin film transistor Tr. The OLED D further includes an emissive layer 220 with at least one emitting unit and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a top-emission type, a reflective electrode or a reflective layer may be disposed under the first electrode 210. For example, the reflective electrode or the reflective layer may include, but are not limited to, aluminum-palladium-copper (APC) alloy.

In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 2, 10, 12, 14 and 16). In one aspect, the emissive layer 220 may have single emitting unit. Alternatively, the emissive layer 220 may have multiple emitting units to form a tandem structure.

At least one EML in the emissive layer 220 may comprise plural delayed fluorescent materials each of which has adjusted exciton energy level. It is possible for the organic light emitting display device 100 to enhance its luminous efficiency and luminous lifetime by introducing plural delayed fluorescent materials in the EML. If necessary, it is possible for the display device 100 to increase its color purity by introducing fluorescent materials with adjusted excited energy level and narrow FWHM (full width at half maximum) in the EML.

The second electrode 230 is disposed over the substrate 110 above which the emissive layer 220 is disposed. The second electrode 230 may be disposed over a whole display area and may include a conductive material with a relatively low work function value compared to the first electrode 210. The second electrode 230 may be a cathode. For example, the second electrode 230 may include, but is not limited to, aluminum (Al), magnesium (Mg), calcium (Ca), silver (Ag), alloy thereof or combination thereof such as aluminum-magnesium alloy (Al—Mg).

In addition, an encapsulation film 170 may be disposed over the second electrode 230 in order to prevent outer moisture from penetrating into the OLED D. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the organic light emitting display device 100 may be a flexible display device.

[Organic Light Emitting Diode]

Figure 2:
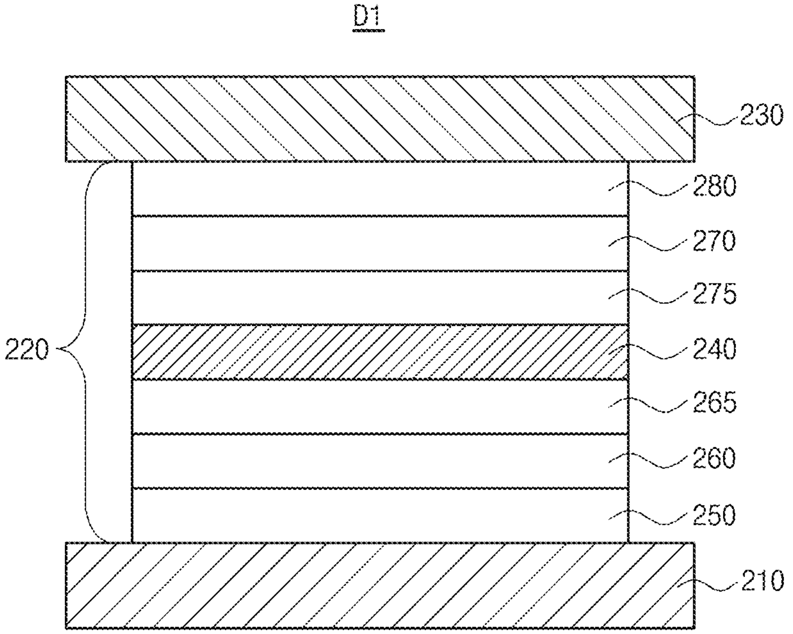
FIG. 2 is a schematic cross-sectional view illustrating an OLED in accordance with an exemplary aspect of the present disclosure.

FIG. 2 is a schematic cross-sectional view illustrating an OLED in accordance with an exemplary aspect of the present disclosure. As illustrated in FIG. 2, the OLED D1 comprises first and second electrodes 210 and 230 facing each other, an emissive layer 220 having single emitting unit disposed between the first and second electrodes 210 and 230. The emissive layer 220 comprises an EML 240 disposed between the first and second electrodes 210 and 230. Also, the emissive layer 220 may further comprise a HIL 250 and a HTL260 that is laminated sequentially between the first electrode 210 and the EML 240, and an ETL 270 and an EIL 280 that is laminated sequentially between the EML 240 and the second electrode 230.

Alternatively, the emissive layer 220 may further comprise a first exciton blocking layer, i.e. an EBL 265 disposed between the HTL 260 and the EML 240 and/or a second exciton blocking layer, i.e. a HBL 275 disposed between the EML 240 and the ETL 270.

The first electrode 210 may be an anode that provides a hole into the EML 240. The first electrode 210 may include, but is not limited to, a conductive material having a relatively high work function value, for example, a transparent conductive oxide (TCO). In an exemplary aspect, the first electrode 210 may include, but is not limited to, ITO, IZO, ITZO, SnO, ZnO, ICO, AZO, and the like.

The second electrode 230 may be a cathode that provides an electron into the EML 240. The second electrode 230 may include, but is not limited to, a conductive material having a relatively low work function values, i.e., a highly reflective material such as Al, Mg, Ca, Ag, alloy thereof, combination thereof, and the like.

The EML 240 may comprise a first compound, a second compound and a third compound. For example, the first compound may be a (first) host H1 and each of the second and third compounds may be a first delayed fluorescent material DF1 and a second delayed fluorescent material DF2, respectively. As an example, the EML 240 may emit, but is not limited to, green color.

The HIL 250 is disposed between the first electrode 210 and the HTL 260 and improves an interface property between the inorganic first electrode 210 and the organic HTL 260. In one exemplary aspect, the HIL 250 may include, but is not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiphene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 250 may be omitted in compliance with a structure of the OLED D1.

The HTL 260 is disposed adjacently to the EML 240 between the first electrode 210 and the EML 240. In one exemplary aspect, the HTL 260 may include, but is not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylphenyl)-N,N'-bis (phenyl)-benzidine] (Poly-TPD), Poly[(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl] cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The ETL 270 and the EIL 280 may be laminated sequentially between the EML 240 and the second electrode 230. The ETL 270 includes a material having high electron mobility so as to provide electrons stably with the EML 240 by fast electron transportation.

In one exemplary aspect, the ETL 270 may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 270 may comprise, but is not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyri din-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr) and/or tris(phenylquinoxaline) (TPQ).

The EIL 280 is disposed between the second electrode 230 and the ETL 270, and can improve physical properties of the second electrode 230 and therefore, can enhance the lifetime of the OLED D1. In one exemplary aspect, the EIL 280 may comprise, but is not limited to, an alkyl metal halide and/or alkaline earth metal halide such as LiF, CsF, NaF, $BaF_2$ and the like, and/or an organic metal compound such as lithium quinolate, lithium benzoate, sodium stearate, and the like.

When holes are transferred to the second electrode 230 via the EML 240 and/or electrons are transferred to the first electrode 210 via the EML 240, the OLED D1 may have short lifetime and reduced luminous efficiency. In order to prevent these phenomena, the OLED D1 in accordance with this aspect of the present disclosure may have at least one exciton blocking layer adjacent to the EML 240.

For example, the OLED D1 of the exemplary aspect includes the EBL 265 between the HTL 260 and the EML 240 so as to control and prevent electron transfers. In one exemplary aspect, the EBL 265 may comprise, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-Bis(carbazol-9-yl)benzene (mCP), mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole.

In addition, the OLED D1 may further include the HBL 275 as a second exciton blocking layer between the EML 240 and the ETL 270 so that holes cannot be transferred from the EML 240 to the ETL 270. In one exemplary aspect, the HBL 275 may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 270.

For example, the HBL 275 may comprise a compound having a relatively low HOMO energy level compared to the luminescent materials in EML 240. The HBL 275 may comprise, but is not limited to, BCP, BAlq, $Alq_3$, PBD, spiro-PBD, Liq, Bis-4,5-(3,5-di-3-pyridylphenyl)-2-methylpyrimidine (B3PYMPM), Bis[2-(diphenylphosphino)phenyl] ether oxide (DPEPO), 9-(6-(9H-carbazol-9-yl)pyridine-3-yl)-9H-3,9'-bicarbazole and combination thereof.

As described above, light is emitted in the OLED as holes injected from the anode and electrons injected from the cathode are recombined to form excitons in EML and then unstable excited state excitons return to a stable ground state. An external quantum efficiency (EQE, $\eta_{ext}$) can be calculated as the following Equation:

$$\eta_{ext}=\eta_{S/T}\times\Gamma\times\Phi\times\eta_{out\text{-}coupling}$$

wherein $\eta_{S/T}$ is a singlet/triplet ratio; $\Gamma$ is a charge balance factor; $\Phi$ is a radiative efficiency; and $\eta_{out\text{-}coupling}$ is an out-coupling efficiency.

The charge balance factor means a balance between a hole and an electron forming an exciton and generally has "1" considering 1:1 matching of 100%. The radiative quantum efficiency is a value involved in a luminous efficiency of the substantially luminescent material and depends upon photoluminescence (PL) of a dopant in a host-dopant system. The out-coupling efficiency is a factor for how efficiently the light of the luminescent molecule can be extracted. In general, when a thin film is fabricated through thermal evaporation of an isotropic molecule, individual luminescent molecule does not have an ordered directionality, but exits in a disordered state. Therefore, the out-coupling efficiency is generally assumed to be a value of "0.2" in this random orientation state.

In addition, when holes and electrons meet to form exciton, singlet exciton with a paired spin state and triplet exciton with an unpaired spin state is generated in a ratio of 1:3 in theory. Since only the singlet exciton participates in luminescence and the remaining 75% triplet excitons cannot participate in luminescence in the fluorescent material, the singlet/triplet ratio is 1:3 in the conventional fluorescent material. Therefore, when taking all four factors defined in the above Equation into account, the maximum luminous efficiency of the OLED using the conventional fluorescent material is only about 5%.

On the other hand, phosphorescent materials have a luminescent mechanism that converts both the singlet and triplet excitons to light. Phosphorescent materials convert singlet exciton into triplet exciton through intersystem crossing (ISC). Therefore, when using phosphorescent materials using both singlet exciton and triplet exciton, it is possible to improve the low luminous efficiency of the fluorescent materials.

However, the commercially available green phosphorescent materials are an organometallic complex in which a noble metal atom such as iridium (Ir) and platinum (Pt) is arranged in the center of the molecule. Since the green phosphorescent materials are very expensive, there exit a lot of restrictions on utilization thereof. In addition, blue phosphorescent materials have too low color purity and too short lifetime to be applied into commercial display devices. Thus, it is necessary to improve the disadvantages of the phosphorescent materials and the low luminous efficiency of the blue luminescent materials.

Recently, a delayed fluorescent material, which can solve the problems accompanied by the conventional art fluorescent and/or phosphorescent materials, has been developed. Representative delayed fluorescent material is a thermally-activated delayed fluorescent (TADF) material. Since the delayed fluorescent material generally has both an electron donor moiety and an electron acceptor moiety within its molecular structure, it can be converted to an intramolecular charge transfer (ICT) state. In case of using the delayed fluorescent material as a dopant, it is possible to use both the singlet energy and the triplet energy during the luminescent process, unlike the conventional fluorescent materials.

The luminous mechanism of the delayed fluorescent material will be explained with referring to FIG. 3, which is a schematic diagram illustrating a luminous mechanism in case of using single delayed fluorescent material in the EML and illustrates a quenching of triplet exciton energy caused by conversion of triplet exciton to a hot triplet exciton.

Figure 3:
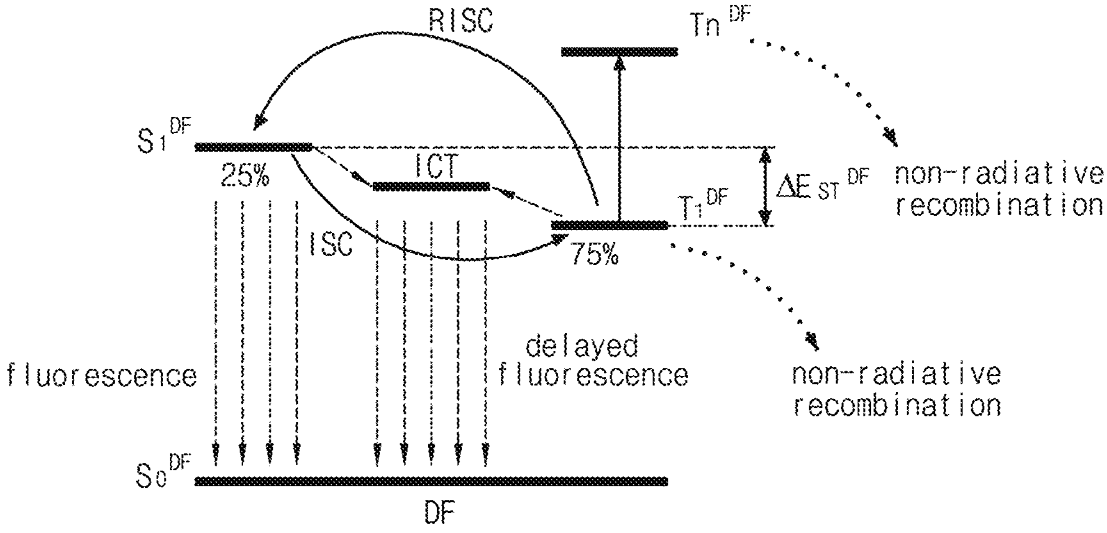
FIG. 3 is a schematic diagram illustrating a luminous mechanism in case of using single delayed fluorescent material in the EML and illustrates a quenching of triplet exciton energy caused by conversion of triplet exciton to a hot triplet exciton.

As illustrated in FIG. 3, the excitons of singlet energy level $S_1^{DF}$ as well as the excitons of triplet energy level $T_1^{DF}$ in the delayed fluorescent material DF can be transferred to an intermediate energy level state, i.e. ICT state, and then the intermediate stated excitons can be shifted to a ground state ($S_0^{DF}$; $S_1^{DF}$→ICT←$T_1^{DF}$). Since the excitons of singlet energy level $S_1^{DF}$ as well as the excitons of triplet energy level $T_1^{DF}$ in the delayed fluorescent material is involved in the luminescent process, the delayed fluorescent material can improve its luminous efficiency.

Since both the Highest Occupied Molecular Orbital (HOMO) and the Lowest Unoccupied Molecular orbital (LUMO) are widely distributed over the whole molecule within the common fluorescent material, it is not possible to inter-convert exciton energies between the singlet energy level and the triplet energy level within the common fluorescent material (selection rule). In contrast, since the delayed fluorescent material DF, which can be converted to ICT state, has little orbital overlaps between HOMO and LUMO, there is little interaction between the HOMO state and the LUMO state. As a result, the changes of spin states of electrons do not have an influence on other electrons, and a new charge transfer band (CT band) that does not follow the selection rule is formed within the delayed fluorescent material.

In other words, since the delayed fluorescent material DF has the electron acceptor moiety spacing apart from the electron donor moiety within the molecule, it exists as a polarized state having a large dipole moment within the molecule. As the interaction between HOMO and LUMO becomes little in the state where the dipole moment is polarized, the triplet excitons as well as the singlet excitons can be converted to ICT state. In other words, ICT complex can be excited to a CT state in which singlet exciton and triplet exciton can be exchanged mutually, thus the triplet excitons as well as singlet excitons can be involved in the luminescent process.

In case of driving an OLED that includes the delayed fluorescent material DF, both 25% singlet excitons and 75% triplet excitons are converted to ICT state by heat or electrical field, and then the converted excitons drops to the ground state $S_0$ with luminescence. Therefore, the delayed fluorescent material may have 100% internal quantum efficiency in theory.

The delayed fluorescent material DF must has an energy level bandgap $\Delta E_{ST}^{DF}$ equal to or less than about 0.3 eV, for example, from about 0.05 to about 0.3 eV, between the excited singlet energy level $S_1^{DF}$ and the excited triplet energy level $T_1^{DF}$ so that exciton energy in both the excited singlet energy level $S_1^{DF}$ and the excited triplet energy level $T_1^{DF}$ can be transferred to the ICT state. The material having little energy level bandgap between the singlet energy level $S_1^{DF}$ and the triplet energy level $T_1^{DF}$ can exhibit common fluorescence with Inter system Crossing (ISC) in which the excitons of singlet energy level $S_1^{DF}$ can be transferred to the excitons of triplet energy level $T_1^{DF}$, as well as delayed fluorescence with Reverser Inter System Crossing (RISC) in which the excitons of triplet energy level $T_1^{DF}$ can be transferred upwardly to the excitons of singlet energy level $S_1^{DF}$, and then the exciton of singlet energy level $S_1^{DF}$ transferred from the triplet energy level $T_1^{DF}$ can be transferred to the ground state $S_0^{DF}$.

However, the delayed fluorescent material DF has low luminous lifetime owing to using the triplet exciton energy as well as the singlet exciton energy via CT luminescent mechanism. One of the factors that the delayed fluorescent material DF has a low luminescent lifetime is that RISC mechanism where the triplet exciton energy generated at the lowest energy level $T_1^{DF}$ among the triplet energy levels in the delayed fluorescent material is transferred to the ICS state or the singlet energy level is occurred slowly. Accordingly, the triplet excitons in the delayed fluorescent material DF exists at the lowest triplet energy level $T_1^{DF}$ among the triplet energy levels for a long time. Due to the couplings between the remained triplet excitons at the lowest triplet energy level $T_1^{DF}$, the remained triplet excitons are converted into triplet excitons having higher triplet energy levels $T_n^{DF}$ ($T_2^{DF}$, $T_3^{DF}$, $T_4^{DF}$ . . . ) than the lowest triplet energy level $T_1^{DF}$.

As used herein, the excited triplet energy levels ($T_2$, $T_3$, $T_4$ . . . ) higher than the lowest triplet level $T_1$ among the excited triplet energy level are collectively referred to as "$T_n$". Further, the excited triplet energy level $T_n$ higher than the lowest excited triplet energy level $T_1$ among the excited triplet energy level is referred to as a hot triplet energy level. Moreover, the exciton at the hot triplet energy level is referred to as a hot triplet exciton.

The hot triplet exciton has a higher energy level than the exciton at the lowest excited triplet energy level $T_1^{DF}$ among the excited triplet energy levels. Since the hot triplet exciton can destroy other molecular bonds and are unstable, some of the triplet excitons are quenched as a non-radiative recombination, thereby reducing the luminescence lifetime of the delayed fluorescent material DF. In other words, the hot triplet exciton owing to triplet-triplet annihilation (TTA) is one of the causes of the lifetime reduction of the delayed fluorescent material DF.

Figure 4:
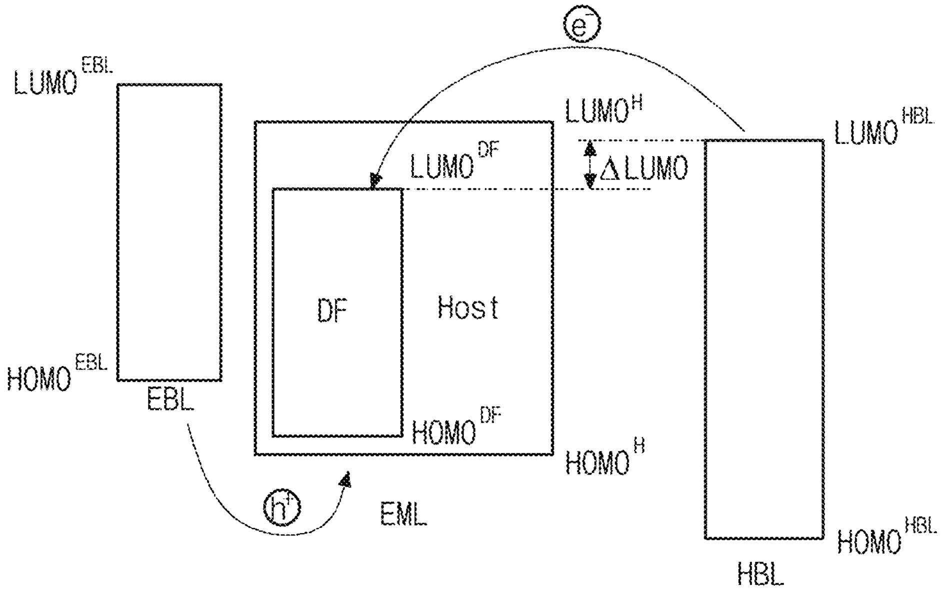
FIG. 4 is a schematic diagram illustrating relative HOMO energy levels and LUMO energy levels in the EML applying single delayed fluorescent material and exciton blocking layers adjacent to the EML.

In addition, it is necessary to consider energy levels among the plural emissive layers so that the OLED can realize efficient luminescence. FIG. 4 is a schematic diagram illustrating relative HOMO energy levels and LUMO energy levels in the EML applying single delayed fluorescent material and exciton blocking layers adjacent to the EML. As illustrated in FIG. 4, the EML comprising the host and the delayed fluorescent material is designed to have a LUMO energy level $LUMO^H$ of the host shallower than a LUMO energy level $LUMO^{DF}$ of the delayed fluorescent material DF and to have HOMO energy level $HOMO^H$ of the host deeper than or equal to a HOMO energy level $HOMO^{DF}$ of the delayed fluorescent material.

Meanwhile, the emissive layer is designed to have a LUMO energy level $LUMO^{EBL}$ of the EBL shallower than the LUMO energy level $LUMO^H$ of the host in the EML and to have a HOMO energy level $HOMO^{EBL}$ of the EBL deeper than each of the HOMO energy level $HOMO^H$ of the host and the HOMO energy level $HOMO^{DF}$ of the delayed fluorescent material in the EML so as to prevent electrons from leaking to the first electrode. In addition, the emissive layer is designed to have a HOMO energy level $HOMO^{HBL}$ of the HBL deeper than each of the HOMO energy level $HOMO^H$ of the host and the HOMO energy level $HOMO^{DF}$ of the delayed fluorescent material in the EML so as to prevent holes from leaking to the second electrode. On the other hand, the emissive layer is designed to have a LUMO energy level $LUMO^{HBL}$ of the HBL deeper than the LUMO energy level $LUMO^H$ of the host in the EML but shallower than the LUMO energy level $LUMO^{DF}$ of the delayed fluorescent material in the EML. Accordingly, electrons generated at the second electrode can be directly transferred from the HBL to the delayed fluorescent material in the EML.

However, the LUMO energy level $LUMO^{DF}$ of the currently widely used delayed fluorescent material is very deep compared to the LUMO energy level $LUMO^{HBL}$ of the HBL. That is, an energy level bandgap ΔLUMO between the LUMO energy level $LUMO^{DF}$ of the delayed fluorescent material in the EML and the LUMO energy level $LUMO^{HBL}$ of the HBL is 0.5 eV or more. Due to the large LUMO energy bandgap ΔLUMO between the HBL and the delayed fluorescent material, electrons injected from the HBL have a tendency to be trapped in the delayed fluorescent material, thus electron injection and transfer performances are lowered in the EML.

Figure 5:
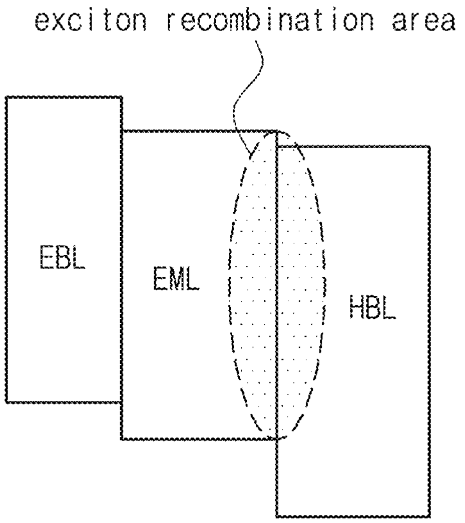
FIG. 5 is a schematic diagram illustrating exciton recombination area in the EML applying single delayed fluorescent material.

The driving voltage of the OLED is increased as the electron injection and transfer performances are lowered. In addition, as illustrated in FIG. 5, the exciton recombination area among holes and electrons in the EML is biased toward the HBL as holes and electrons are not injected into the EML in balance. The concentration of the delayed fluorescent material in the EML may be increased so as to improve electron injection and transfer performance to some extent, but there is a limit to improve luminous efficiency and luminous lifetime of the OLED.

On the other hand, the EML 240 of the OLED D1 in accordance with an exemplary aspect comprises a host (first host), a first delayed fluorescent material and a second delayed fluorescent material. Charges can be injected into the EML 240 in balance so that the OLED D1 can improve its luminous efficiency and luminous lifetime by introducing plural delayed fluorescent materials having different energy levels into the EML.

Figure 6:
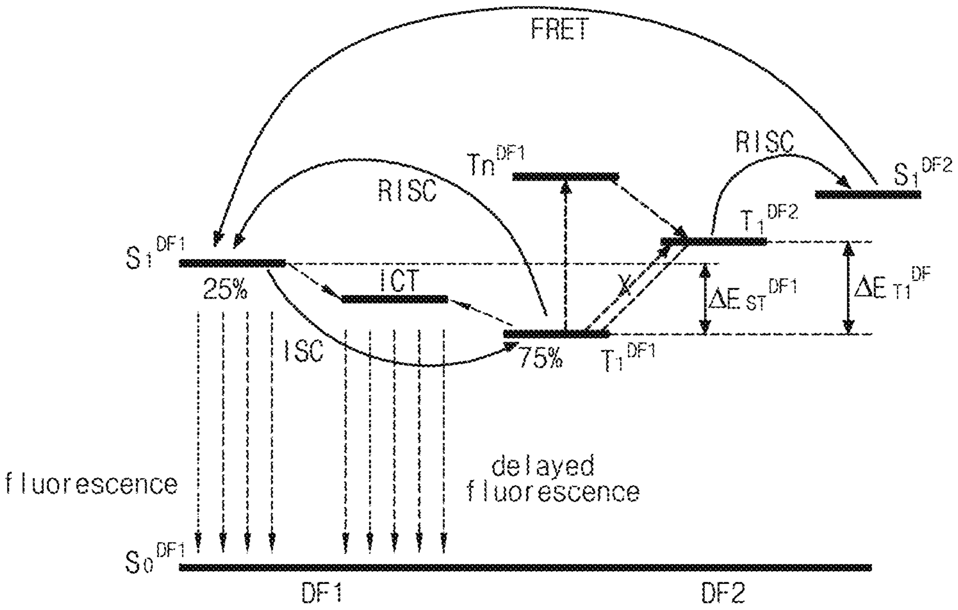
FIG. 6 is a schematic diagram illustrating a luminous mechanism in case of applying plural delayed fluorescent materials having different excited singlet and triplet energy levels in the EML in accordance with the present disclosure and illustrates that triplet exciton energy is not quenched.

FIG. 6 is a schematic diagram illustrating a luminous mechanism in case of applying plural delayed fluorescent materials having different excited singlet and triplet energy levels in the EML in accordance with the present disclosure. Referring to FIGS. 2 and 6, the EML 240 comprises the first delayed fluorescent material DF1 and the second delayed fluorescent material DF2 as well as the first host. A hot triplet exciton $T_n^{DF1}$ is generated by high temperature couplings among the excitons at the lowest excited triplet energy level $T_1^{DF1}$ of the first delayed fluorescent material DF1 by the luminescence mechanism of the delayed fluorescent material. The unstable hot triplet exciton $T_n^{DF1}$ is transferred to an excited triplet energy level $T_1^{DF2}$ of the second delayed fluorescent material DF2, and then transferred exciton energy at the excited triplet energy level $T_1^{DF2}$ of the second delayed fluorescent material DF2 is transferred again to the lowest excited triplet energy level $T_1^{DF1}$ of the first delayed fluorescent material DF1.

As described above, the exciton energy of the hot triplet energy level $T_n^{DF1}$ at the first delayed fluorescent material that realize substantial luminescence is not lost by TTA, but can be transferred again to the lowest excited triplet energy level $T_1^{DF1}$. The exciton energy of the lowest triplet energy level $T_1^{DF1}$ not quenched by TTA is converted into the excited singlet energy level $S_1^{DF1}$ of the first delayed fluorescent material again by RISC mechanism and can contribute to luminescence.

The second delayed fluorescent material DF2 can remove the hot triplet exciton in the state of the hot triplet energy level $T_n^{DF1}$ generated by the TTA of the first delayed fluorescent material DF1, and thereby preventing or minimizing the luminous lifetime of the OLED from being deteriorated caused by the TTA. In other words, the second delayed fluorescent material DF2 absorbs the unstable hot triplet exciton generated in the luminescent process of the first delayed fluorescent material DF1, and thereby increasing the luminous lifetime of the OLED D1.

Exciton energy transfer or quenching process from the lowest excited triplet energy level $T_1^{DF1}$ of the first delayed fluorescent material DF1 to the hot triplet energy level $T_n^{DF2}$ and the excited triplet energy level $T_1^{DF2}$ of the second delayed fluorescent material DF2 as well as from the excited triplet energy level $T_1^{DF2}$ of the second delayed fluorescent material DF2 to the lowest excited triplet energy level $T_1^{DF1}$ of the first delayed fluorescent material DF1 occurs very rapidly. Since the triplet exciton exits for a very short time at the excited triplet energy level $T_1^{DF2}$ of the second delayed fluorescent material DF2 in the quenching process, the hot triplet exciton caused by the TTA rarely occurs in the second delayed fluorescent material DF2.

In this case, an energy level bandgap $\Delta E_{T1}^{DF}$ between the lowest excited triplet energy level $T_1^{DF1}$ of the first delayed fluorescent material DF1 and the excited triplet energy level $T_1^{DF2}$ of the second delayed fluorescent material DF2 may be considered. As an example without limitation, the second delayed fluorescent material DF2 should have the excited triplet energy level $T_1^{DF2}$ such that the triplet exciton of the lowest excited triplet energy level $T_1^{DF1}$, which contributes to the luminescence of the first delayed fluorescent material DF1, is not quenched. In addition, since the second delayed fluorescent material DF2 should absorb the hot triplet excitons generated at the first delayed fluorescent material DF1 through quenching mechanism, the excited triplet energy level $T_1^{DF2}$ of the second delayed fluorescent material DF2 must be lower than the hot triplet energy level $T_n^{DF1}$ in the luminescent process of the first delayed fluorescent material DF1.

The triplet excitons quenched from the hot triplet exciton of the first delayed fluorescent material DF1 to the excited triplet energy level $T_1^{DF2}$ of the second delayed fluorescent material DF2 contributes to the luminescence through two mechanisms. First, the triplet excitons quenched with the excited triplet energy level $T_1^{DF2}$ of the second delayed fluorescent material DF2 are transferred again to the lowest excited triplet energy level $T_1^{DF1}$, which is lower than the excited triplet energy level $T_1^{DF2}$ of the second delayed fluorescent material DF2, of the first delayed fluorescent material DF1. Second, the triplet excitons quenched with the excited triplet energy level $T_1^{DF1}$ of the second delayed fluorescent material DF2 is converted to an excited singlet energy level $S_1^{DF2}$ by its own RISC mechanism, and the converted singlet exciton energy of the second delayed fluorescent material DF2 can be transferred to an excited singlet energy level $S_1^{DF1}$ of the first delayed fluorescent material DF1 through Forster Resonance Transfer (FRET).

The second delayed fluorescent material DF2 should have the excited triplet energy level $T_1^{DF2}$ that can absorb the hot triplet excitons at the excited hot triplet energy level TnDF1, which is generated by the TTA of the first delayed fluorescent material DF1, through the quenching, and can transfer the absorbed triplet excitons to the lowest excited triplet energy level $T_1^{DF1}$ of the first delayed fluorescent material DF1 again. In addition, the second delayed fluorescent material DF2 should have the excited triplet energy level $T_1^{DF2}$ that cannot directly absorb the triplet excitons generated at the lowest excited triplet energy level $T_1^{DF1}$ of the first delayed fluorescent material DF1. In one exemplary aspect, the excited triplet energy level $T_1^{DF1}$ of the first delayed fluorescent material DF1 and the excited triplet energy level $T_1^{DF1}$ of the second delayed fluorescent material DF2 satisfy the following relationship in Equation (1):

$$T_1^{DF2} > T_1^{DF1} \quad (1)$$

When the excited triplet energy level $T_1^{DF2}$ of the second delayed fluorescent material DF2 is less than or equal to the excited triplet energy level $T_1^{DF1}$ of the first delayed fluorescent material DF1, the exciton energy is transferred directly to the triplet of the second delayed fluorescent material DF2 from the lowest excited triplet energy level $T_1^{DF1}$ of the first delayed fluorescent material DF1, thereby reducing the luminous efficiency. As an example without limitation, the lowest excited triplet energy level $T_1^{DF1}$ of the first delayed fluorescent material DF1 and the excited triplet energy level $T_1^{DF2}$ of the second delayed fluorescent material DF2 may satisfy the following relationship in Equation (2):

$$0.1\ eV \le T_1^{DF2} - T_1^{DF1} \le 0.4\ eV \quad (2)$$

When the energy level bandgap $\Delta E_{T1}^{DF}$ between the lowest excited triplet energy level $T_1^{DF1}$ of the first delayed fluorescent material DF1 and the excited triplet energy level $T_1^{DF2}$ of the second delayed fluorescent material is less than 0.1 eV, at least some of the triplet excitons generated at the lowest excited triplet energy level $T_1^{DF1}$ of the first delayed fluorescent material DF1 are transferred to the excited triplet energy level $T_n^{DF2}$ of the second delayed fluorescent material DF2 to become triplet quenching. As a result, as the amount of excitons transferred to the excited singlet energy level $S_1^{DF1}$ form the lowest excited triplet energy level $T_1^{DF1}$ at the first delayed fluorescent material DF1 via RISC is decreased, the luminous efficiency of the OLED D1 may be reduced.

Also, as the second delayed fluorescent material DF2 absorbs at least some of the triplet excitons quenched at the first delayed fluorescent material DF1, the second delayed fluorescent material DF2 also emits light. As both the first delayed fluorescent material DF1 and the second delayed fluorescent material DF2 having different emission wavelengths emit light simultaneously, the color purity may decrease as the FWHM of the total emission wavelength increases. In addition, since the second delayed fluorescent material DF2 cannot absorb the hot triplet exciton generated at the first delayed fluorescent material DF1, the luminous lifetime of the OLED D1 may be reduced.

On the other hand, when the energy level bandgap $\Delta E_{T1}^{DF}$ between the excited state triplet energy level $T_1^{DF2}$ of the second delayed fluorescent material DF2 and the lowest excited state triplet energy level $T_1^{DF1}$ of the first delayed fluorescent material DF1 is more than 0.4 eV, the second delayed fluorescent material DF2 may not absorb the hot triplet exciton at the hot triplet energy level $T_n^{DF1}$, which is generated by TTA of the first delayed fluorescent material DF1, by the quenching mechanism. For example, the energy level bandgap $\Delta E_{T1}^{DF}$ between the excited state triplet energy level $T_1^{DF2}$ of the second delayed fluorescent material DF2 and the lowest excited state triplet energy level $T_1^{DF1}$ of the first delayed fluorescent material DF1 may be more than or equal to 0.2 eV and less than or equal to 0.3 eV.

Figure 7:
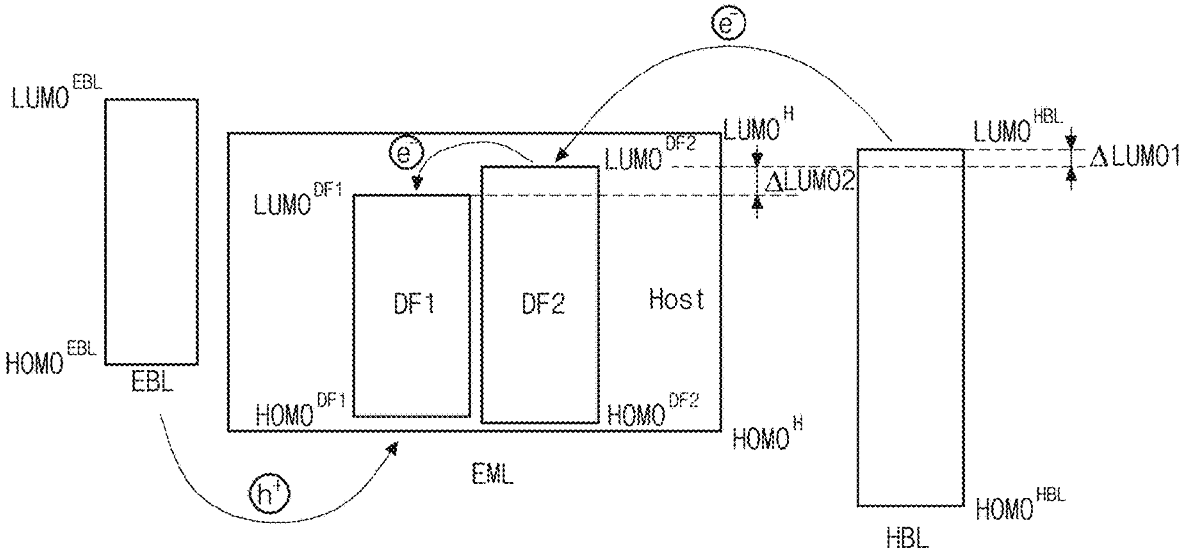
FIG. 7 is a schematic diagram illustrating relative HOMO energy levels and LUMO energy levels in the EML applying plural delayed fluorescent materials having different excited singlet and triplet levels and exciton blocking layers adjacent to the EML in accordance with one exemplary aspect of the present disclosure.

Moreover, when the EML 240 includes the luminous materials such as the first host, the first delayed fluorescent material DF1 and the second delayed fluorescent material DF2, highest occupied molecular orbital (HOMO) energy levels and/or lowest unoccupied molecular orbital (LUMO) energy levels among those luminous materials are considered as another important factor to realize efficient luminescence in the EML 240. FIG. 7 is a schematic diagram illustrating relative HOMO energy levels and LUMO energy levels in the EML applying plural delayed fluorescent materials having different excited singlet and triplet levels and exciton blocking layers adjacent to the EML in accordance with one exemplary aspect of the present disclosure.

As illustrated schematically in FIG. 7, a HOMO energy level $HOMO^H$ of the host is equal to or deeper (lower) than a HOMO energy level $HOMO^{DF1}$ of the first delayed fluorescent material DF1 and/or a HOMO energy level $HOMO^{DF2}$ of the second delayed fluorescent material in the EML 240. In addition, the second delayed fluorescent material DF2 should not interfere with the luminescent mechanism of the first delayed fluorescent material DF1 that realizes substantial light emission. To this end, the first delayed fluorescent material DF1 has the HOMO energy level $HOMO^{DF1}$ identical to or shallower than the HOMO energy level HOMODF2 of the second delayed fluorescent material DF2. As an example, the HOMO energy level $HOMO^{DF1}$ of the first delayed fluorescent material is identical to the HOMO energy level $HOMO^{DF2}$ of the second delayed fluorescent material DF2, or shallower than at least 0.05 eV, for example, at least 0.1 eV and up to 0.2 eV, for example, up to 0.15 eV.

When the HOMO energy levels of the first host H, the first delayed fluorescent material DF1 and the second delayed fluorescent material DF2 satisfy at least one of the conditions described above, the holes injected into the host H can be transferred efficiently to the first delayed fluorescent material DF1 via the second delayed fluorescent material DF2. Accordingly, holes are recombined with electrons at the first delayed fluorescent material DF1 to form excitons irrespective of the second delayed fluorescent material DF2 so that light emission can be occurred at the first delayed fluorescent material DF1.

On the contrary, when the HOMO energy level $HOMO^{DF2}$ of the second delayed fluorescent material DF2 is excessively shallower than the HOMO energy level $HOMO^{DF1}$ of the first delayed fluorescent material DF1, the holes injected via the first host is trapped at the second delayed fluorescent material DF2. Accordingly, as an excited complex, i.e. exciplex is formed between the first delayed fluorescent materials DF1 absorbing electron excitons and the second delayed fluorescent material DF2 trapping holes, ultimate light emission peak is shifted toward longer wavelength ranges, and lifetime of the OLED D1 can be reduced.

The EBL is designed to have the LUMO energy level $LUMO^{EBL}$ shallower than the LUMO energy level $LUMO^H$ of the first host in the EML so as to prevent electrons leaking into the first electrode. In addition, the EBL is designed to have the HOMO energy level $HOMO^{EBL}$ shallower than each of the HOMO energy level $HOMO^H$ of the first host and the HOMO energy levels $HOMO^{DF1}$ and $HOMO^{DF2}$ of the first and second delayed fluorescent materials DF1 and DF2.

On the other hand, the first host H in the EML may be designed to have the LUMO energy level $LUMO^H$ shallower than the LUMO energy levels $LUMO_{DF1}$ and $LUMO^{DF2}$ of the first and second delayed fluorescent materials DF1 and DF2. In addition, the HBL is designed to have the HOMO energy level HOMOHBL shallower than each of the HOMO energy level $HOMO^H$ of the first host and the HOMO energy levels $HOMO^{DF1}$ and $HOMO^{DF2}$ of the first and second delayed fluorescent materials DF1 and DF2 in order to prevent holes from leaking into the second electrode. On the contrary, the HBL is designed to have the LUMO energy level $LUMO_{HBL}$ that is deeper than the LUMO energy level $LUMO^H$ of the first host but is shallower than the LUMO energy levels $LUMO_{DF1}$ and $LUMO^{DF2}$ of the first and second delayed fluorescent materials DF1 and DF2.

As described above, the second delayed fluorescent material DF2 does not interfere with the luminescence mechanism of the first delayed fluorescent material DF1 with promoting electron injection and transfer between the first delayed fluorescent material DF1 and the HBL adjacent to the EML. To this end, the second delayed fluorescent material DF2 has the LUMO energy level $LUMO^{DF2}$ that is shallower than the LUMO energy level $LUMO^{DF1}$ of the first delayed fluorescent material DF1 and that is deeper than the LUMO energy level $LUMO^{HBL}$ of the HBL.

For example, the energy level bandgap ΔLUMO2 between the LUMO energy level $LUMO^{DF1}$ of the first delayed fluorescent material DF1 and the LUMO energy level $LUMO^{DF2}$ of the second delayed fluorescent material DF2 satisfies the following relationship in Equation (3). When the energy level bandgap ΔLUMO2 between the LUMO energy level $LUMO^{DF1}$ of the first delayed fluorescent material DF1 and the LUMO energy level $LUMO^{DF2}$ of the second delayed fluorescent material DF2 satisfies the following relationship in Equation (3), the second delayed fluorescent material DF2 enables electrons to be transferred to the first delayed fluorescent material DF1.

$$LUMO^{DF2}-LUMO^{DF1}\leq 0.3\text{ eV} \quad (3)$$

In one exemplary aspect, the energy level bandgap ΔLUMO2 between the LUMO energy level $LUMO^{DF1}$ of the first delayed fluorescent material DF1 and the LUMO energy level $LUMO^{DF2}$ of the second delayed fluorescent material DF2 satisfies the following relationship in Equation (4):

$$0.1\text{ eV}\leq LUMO^{DF2}-LUMO^{DF1}\leq 0.3\text{ eV} \quad (4)$$

When the energy level bandgap ΔLUMO2 between the first and second delayed fluorescent materials DF1 and DF2 is less than 0.1 eV, electrons may be trapped at the second delayed fluorescent material DF2 in case of transferring electrons to the second delayed fluorescent material DF2 from the HBL. In this case, as an exciplex is formed between the first delayed fluorescent material DF1 absorbing hole excitons and the second delayed fluorescent material DF2 trapping electrons, ultimate light emission peak is shifted toward longer wavelength ranges, and the luminous lifetime of the OLED may be reduced. On the contrary, when the energy level bandgap ΔLUMO2 between the first and second delayed fluorescent materials DF1 and DF2 is more than 0.3 eV, electrons may be trapped at the first delayed fluorescent material DF1.

In addition, the energy level bandgap ΔLUMO1 between the LUMO energy level $LUMO^{DF2}$ of the second delayed fluorescent material DF2 and the LUMO energy level $LUMO^{HBL}$ of the HBL may satisfy the following relationship in Equation (5) so as to transfer electros efficiently to the first delayed fluorescent material DF1 from the HBL:

$$LUMO^{HBL}-LUMO^{DF2}\leq 0.3\text{ eV} \quad (5)$$

When the energy level bandgap ΔLUMO1 between the LUMO energy level $LUMO^{DF2}$ of the second delayed fluorescent material DF2 and the LUMO energy level $LUMO^{HBL}$ of the HBL may satisfy the following relationship in Equation (5), electrons can be injected and transferred rapidly into the first delayed fluorescent material DF1 from the HBL via the second delayed fluorescent material DF2. As an example, the energy level bandgap ΔLUMO1 between the LUMO energy level $LUMO^{DF2}$ of the second delayed fluorescent material DF2 and the LUMO energy level $LUMO^{HBL}$ of the HBL may satisfy the following relationship in Equation (6):

$$0.1\text{ eV}\leq LUMO^{HBL}-LUMO^{DF2}\leq 0.3\text{ eV} \quad (6)$$

When the energy level bandgap ΔLUMO1 between the LUMO energy level $LUMO^{DF2}$ of the second delayed fluorescent material DF2 and the LUMO energy level $LUMO^{HBL}$ of the HBL is less than 0.1 eV, electrons is transferred rapidly to the second delayed fluorescent material DF2 but may be trapped at the first delayed fluorescent material DF1. On the contrary, when the energy level bandgap ΔLUMO1 between the LUMO energy level $LUMO^{DF2}$ of the second delayed fluorescent material DF2 and the LUMO energy level $LUMO^{HBL}$ of the HBL is more than 0.3 eV, electrons may be trapped at the second delayed fluorescent material DF2.

When the LUMO energy levels $LUMO^{H}$, $LUMO^{DF1}$, $LUMO^{DF2}$ and $LUMO^{HBL}$ of the host, the delayed fluorescent materials DF1 and DF2 and HBL satisfy at least one of the above mentioned conditions, electrons can be injected into the first delayed fluorescent material DF1 from the HBL via the second delayed fluorescent material DF2. Accordingly, electrons are recombined with holes at the first delayed fluorescent material DF1 to form excitons irrespective of the second delayed fluorescent material DF2 so that light emission can be occurred at the first delayed fluorescent material DF1.

Figure 8:
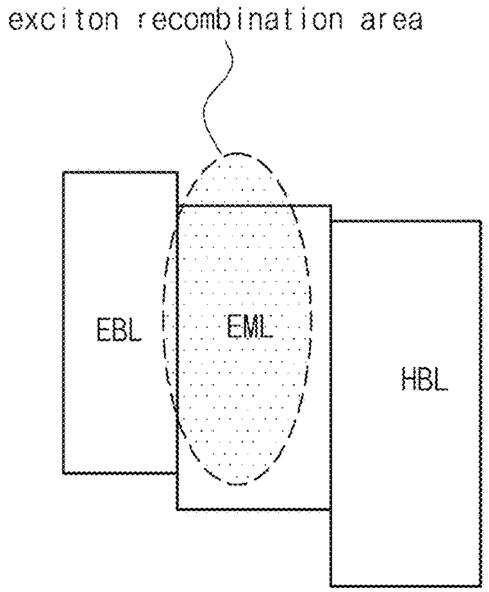
FIG. 8 is a schematic diagram illustrating exciton recombination area in the EML applying plural delayed fluorescent materials having different singlet and triplet energy levels in accordance with one exemplary aspect of the present disclosure.

When the EML 240 comprises plural delayed fluorescent materials DF1 and DF2 each of which has adjusted triplet energy level and LUMO energy level, electron can be injected and transferred into the EML 240. As shown in FIG. 8, as hole and electrons is injected into the EML 240 in balance, the exciton recombination area between holes and electrons is distributed uniformly in the whole area of the EML, including an interface between the EML and the HBL, which enhances the luminous efficiency and luminous lifetime of the OLED D1.

On the other hand, when the LUMO energy level $LUMO^{DF2}$ of the second delayed fluorescent material DF2 relative to the LUMO energy level $LUMO^{DF1}$ of the first delayed fluorescent material DF1 does not satisfy the above described conditions, electrons injected from the HBL are trapped at the second delayed fluorescent material DF2. In this case, an exciplex is formed between the first delayed fluorescent material DF1 absorbing hole excitons and the second delayed fluorescent material DF2 trapping electrons, ultimate light emission peak is shifted toward longer wavelength ranges, and the luminous efficiency and the luminous lifetime of the OLED D1 may not be improved.

In one exemplary aspect, the first delayed fluorescent material DF1 may have a molecular structure in which an electron acceptor moiety and an electron donor moiety are connected via a proper linker so as to realize delayed fluorescence. As an example, the first delayed fluorescent material DF1 may an organic compound having two cyano groups as the electron acceptor moiety and at least one electron donor moiety.

The second delayed fluorescent material DF2 has the excited triplet energy level $T_1^{DF2}$ higher than the lowest excited triplet energy level $T_1^{DF2}$ of the first delayed fluorescent material DF1, so that it can absorb the unstable hot triplet excitons generated at the first delayed fluorescent material DF1 and can minimize or prevent the triplet exciton annihilation at the first delayed fluorescent material DF1. In addition, the second delayed fluorescent material DF2 should have the LUMO energy level $LUMO^{DF2}$ that is shallower than the LUMO energy level $LUMO_{DF1}$ of the first delayed fluorescent material so that it can minimize the trap of electrons injected from the HBL. As an example, the second delayed fluorescent material DF2 may be an organic compound having one cyano group as the electron acceptor moiety and at least one electron donor moiety. For example, the first delayed fluorescent material DF1 may comprise an organic compound having the following structure of Chemical Formula 1 and the second delayed fluorescent material DF2 may comprise an organic compound having the following structure of Chemical Formula 2:

[Chemical Formula 1]

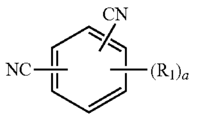

[Chemical Formula 2]

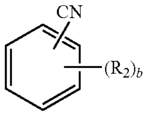

In Chemical Formulae 1 and 2, each of $R_1$ and $R_2$ is independently selected from the group consisting of hydrogen, deuterium, $C_1$-$C_{20}$ alkyl, $C_6$-$C_{30}$ aryl and hetero aryl selected from carbazolyl and acridinyl, wherein the $C_6$-$C_{30}$ aryl is unsubstituted or substituted with $C_1$-$C_{10}$ alkyl, and wherein the hetero aryl is unsubstituted or substituted with at least one of $C_1$-$C_{10}$ alkyl, $C_6$-$C_{30}$ aryl, carbazolyl and acridinyl, or two adjacent groups among $R_1$ or Reform a fused ring or a spiro structure; each of a and b is a number of substituent, a is an integer of 0 (zero) to 3 and b is an integer of 0 (zero) to 4.

For Example, the $C_6$-$C_{30}$ aryl constituting each of $R_1$ and $R_2$ in Chemical Formulae 1 and 2 may comprise, but is not limited to, phenyl or naphthyl. The hetero aryl constituting each of $R_1$ and $R_2$ in Chemical Formulae 1 and 2 may comprise, but is not limited to, anyone of the following structure of Chemical Formula 3:

[Chemical Formula 3]

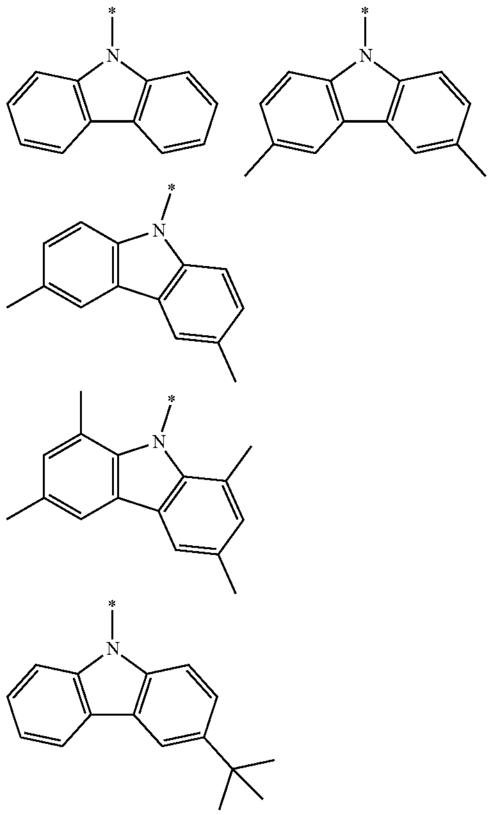

-continued

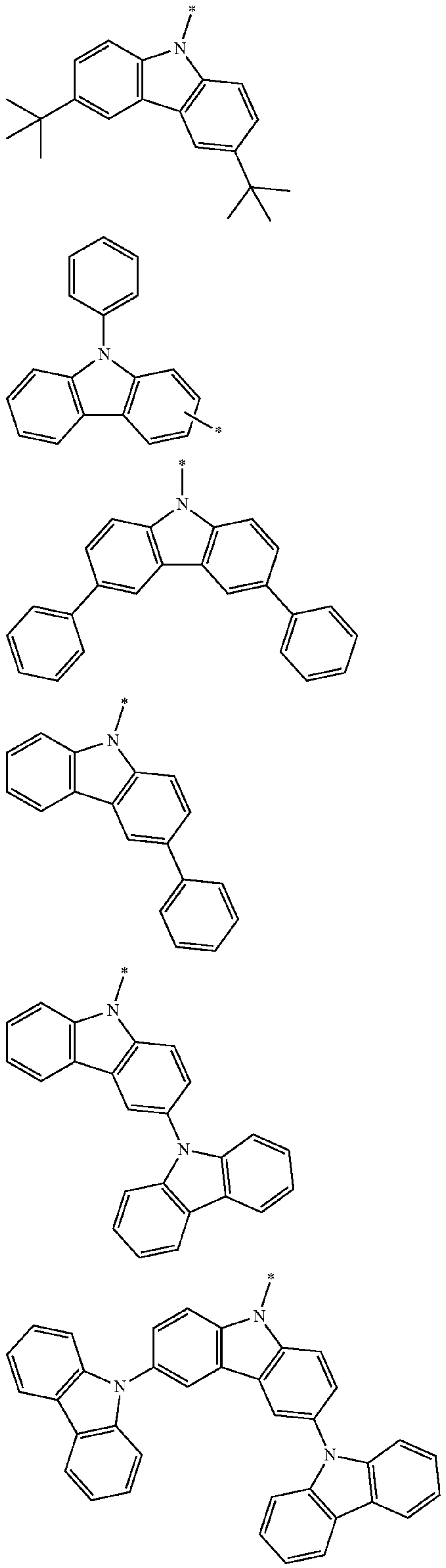

-continued
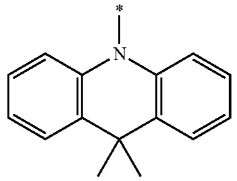
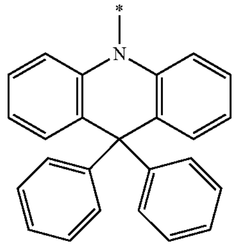
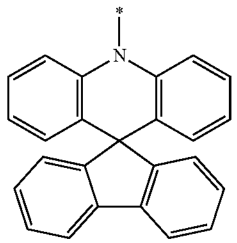
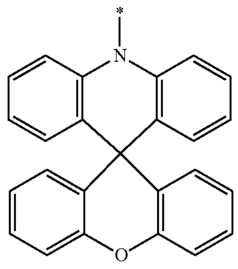
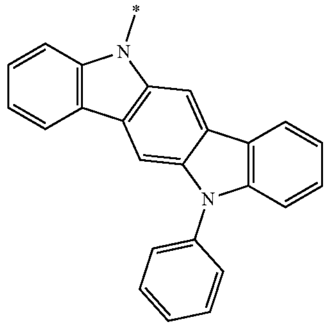 [SMILES: *n1c2ccccc2c2cc3c(cc21)c1ccccc1n3-c1ccccc1]
wherein asterisk indicates a site linked to the phenyl core.
In more detail, the first delayed fluorescent material DF1 may comprise anyone having the following structure of Chemical Formula 4:
[Chemical Formula 4]
1
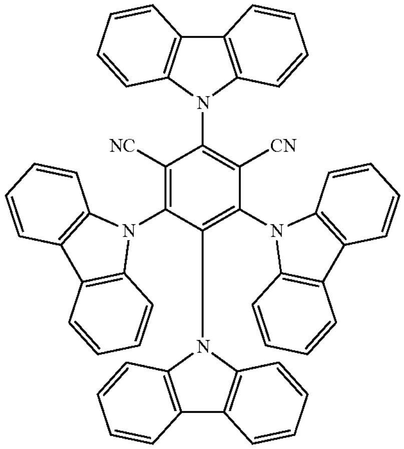
-continued
2
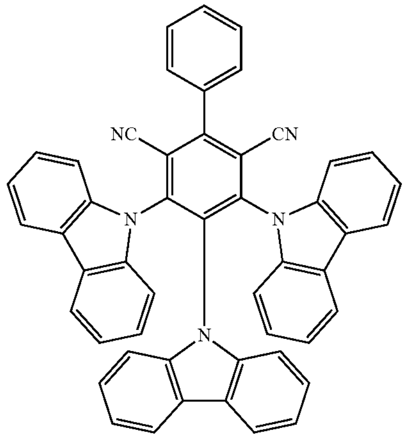
3
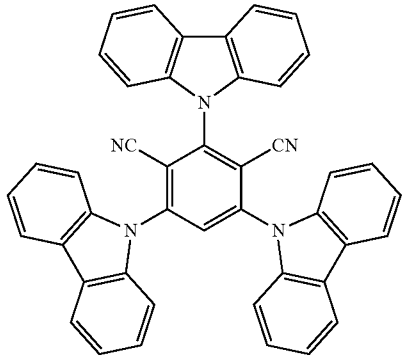
4
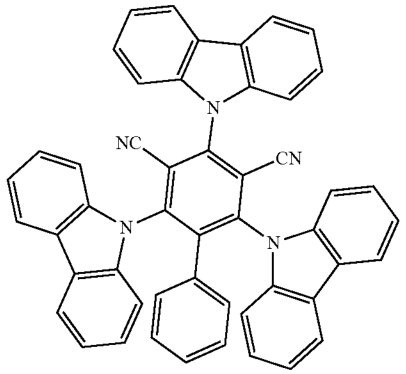
5
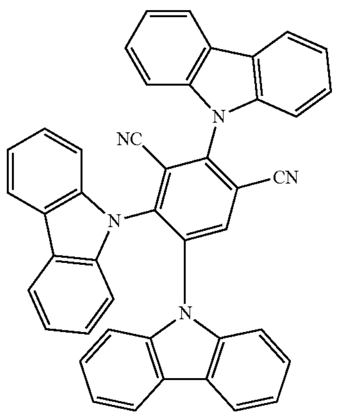

-continued
6
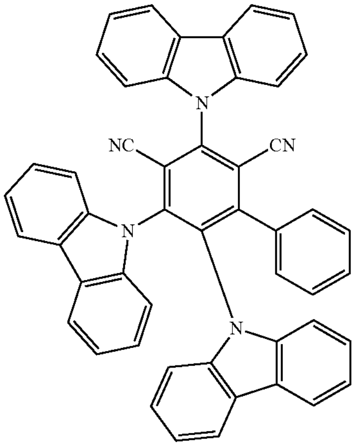
7
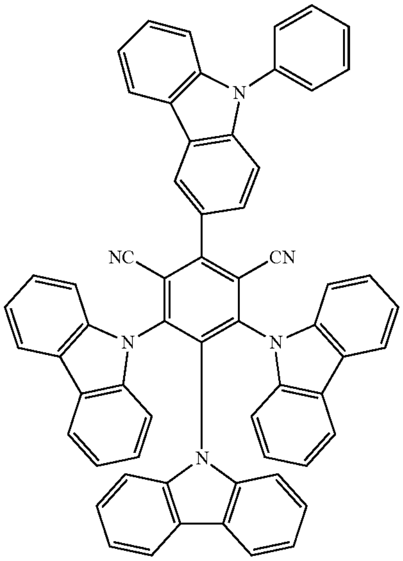
8
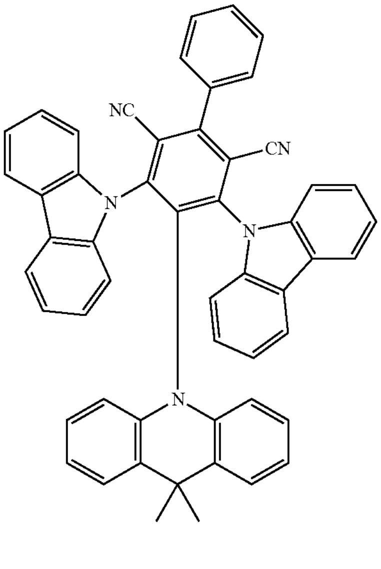
-continued
9
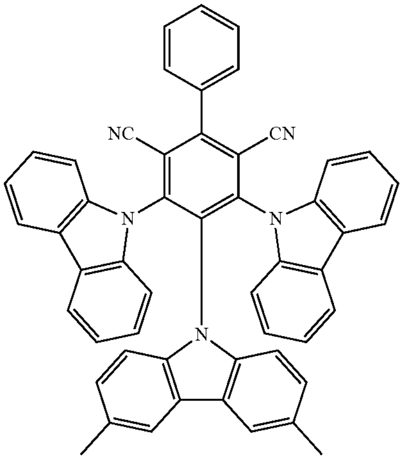
10
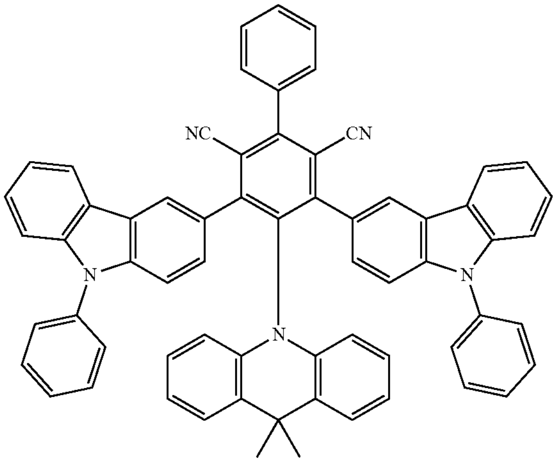
11
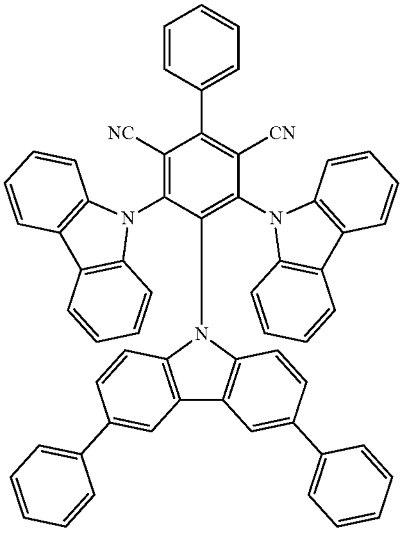

-continued
12
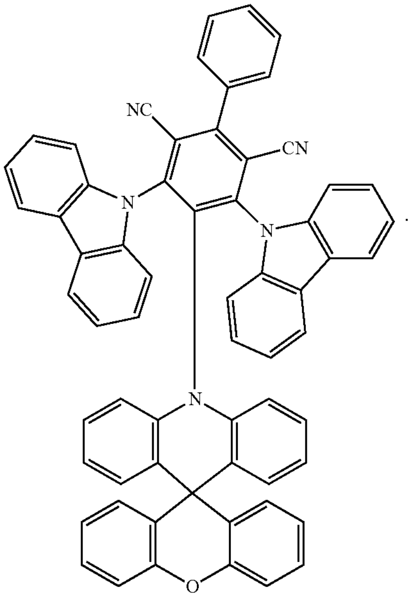
The second delayed fluorescent material DF2 may comprise anyone having the following structure of Chemical Formula 5:
[Chemical Formula 5]
M-1
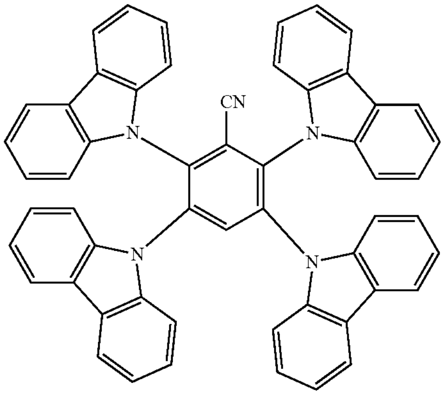
-continued
M-2
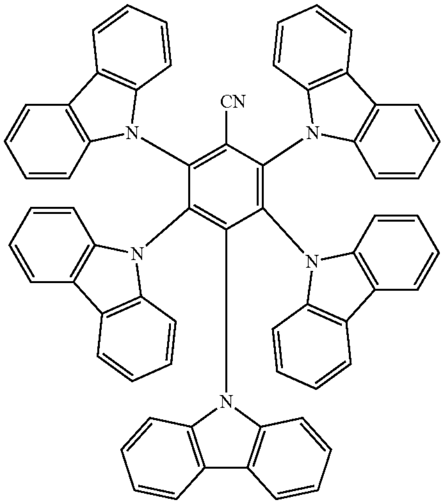
M-3
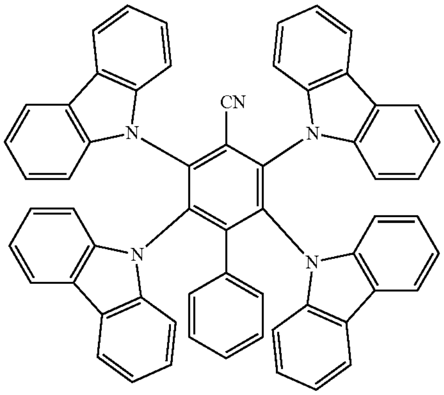
M-4
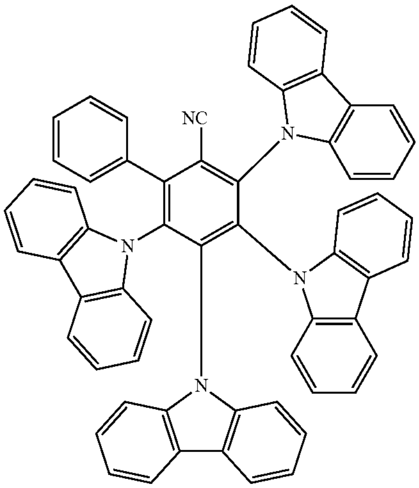

-continued
M-5
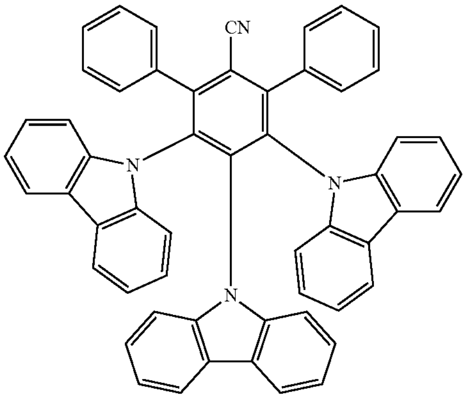
M-6
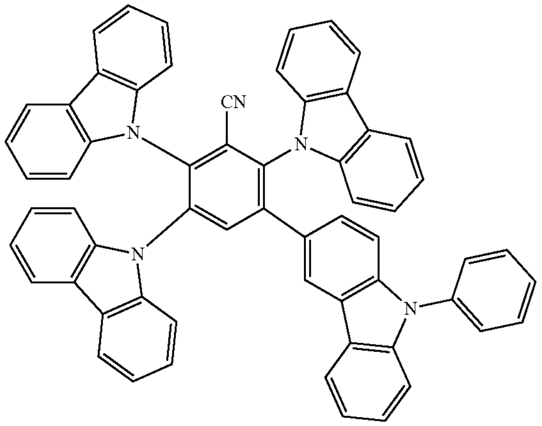
M-7
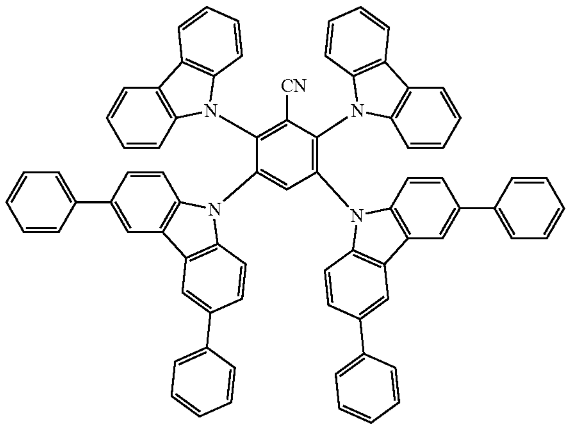
-continued
M-8
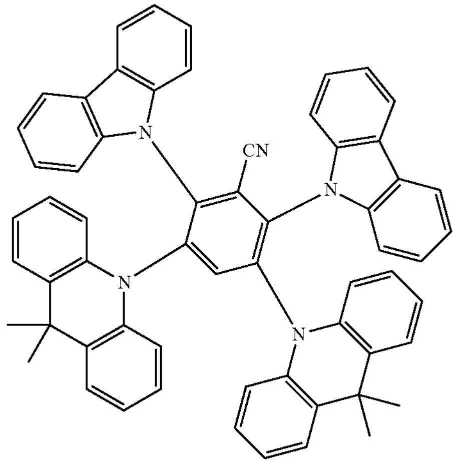
M-9
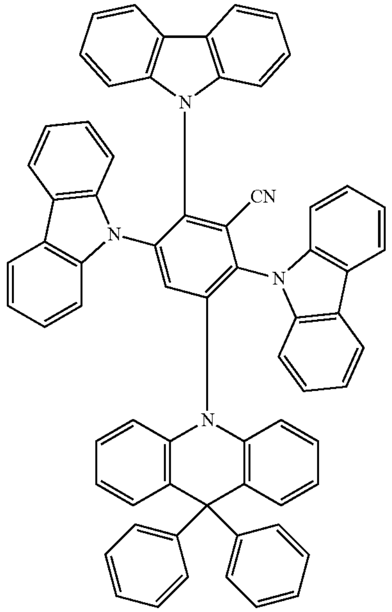

-continued

M-10

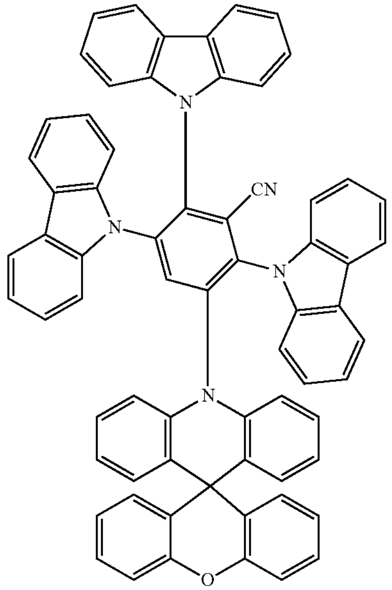

Figure 9:
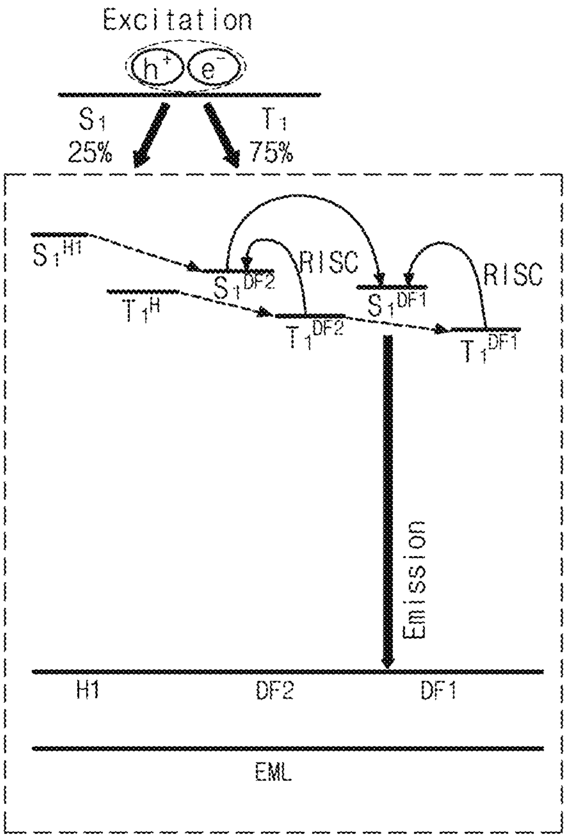
FIG. 9 is a schematic diagram illustrating luminous mechanism by energy level bandgap among a host and plural delayed fluorescent materials in the EML in accordance with one exemplary aspect of the present disclosure.

Now, we describe the singlet energy levels and the triplet energy levels among the luminous materials in the EML 240 with referring to FIG. 9. As illustrated in FIG. 9, the exciton energy generated at the first host H1 should be transferred to the first delayed fluorescent material DF1 via the second delayed fluorescent material DF2 in order to emit light. To this end, each of an excited singlet energy level $S_1^{H1}$ and an excited triplet energy level $T_1^{H1}$ of the first host H1 is higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2, respectively.

As an example, when the excited triplet energy level $T_1^{H1}$ of the first host H1 is not high enough than the excited triplet energy level $T_1^{DF1}$ of the first delayed fluorescent material DF1, the triplet state exciton energy of the first delayed fluorescent material DF1 may be reversely transferred to the excited triplet energy level $T_1^{H1}$ of the first host H1. In this case, the triplet exciton reversely transferred to the first host where the triplet exciton cannot be emitted is quenched as non-emission so that the triplet exciton energy of the first delayed fluorescent material DF1 cannot contribute to luminescence. As an example, the excited triplet energy level $T_1^{H1}$ of the first host H1 may be higher than the excited triplet energy level $T_1^{DF1}$ of the first delayed fluorescent material DF1 by at least about 0.5 eV.

The first host is not limited to specific materials if only the first host has the excited triplet energy level $T_1^{H1}$ higher than the excited triplet energy levels $T_1^{DF1}$ and $T_1^{DF2}$ of the delayed fluorescent materials DF1 and DF2 and its HOMO and LUMO energy levels $HOMO^{H}$ and $LUMO^{H}$ compared to the HOMO and LUMO energy levels $HOMO^{DF1}$, $HOMO^{DF2}$, $LUMO^{DF1}$ and $LUMO^{DF2}$ satisfy at least one conditions defined in the above Equations (1) to (6). As an example, the first H1 host may include, but is not limited to, 9-(3-(9H-carbazol-9-yl)phenyl)-9H-carbazole-3-carbonitrile (mCP-CN), CBP, mCBP, mCP, DPEPO, 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5-Di(carbazol-9-yl)-[1,1'-bipheyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), diphenyl-4-triphenylsilylphenyl-phosphine oxide (TSPO1), 9-(9-phenyl-9H-carbazol-6-yl)-9H-carbazole (CCP), 4-(3-(triphenylen-2-yl)phenyl)dibenzo[b,d]thiophene), 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

When the EML 240 includes the first and second delayed fluorescent materials DF1 and DF2, each of the delayed fluorescent materials DF1 and DF2 may be doped with, but is not limited to, about 10 wt % to about 40 wt % in the EML 240, respectively. In one exemplary aspect, the contents of the second delayed fluorescent material DF2 is no less than the contents of the first delayed fluorescent material DF1 and is no more than twice the contents of the first delayed fluorescent materials DF1.

As an example, when the contents of the second delayed fluorescent material DF1 is less than the contents of the first delayed fluorescent material DF1, a rate of absorbing triplet exciton from the hot triplet exciton energy generated at the first delayed fluorescent material DF1 to the excited triplet energy level $T_1^{DF2}$ of the second delayed florescent material DF2 is faster than a rate of quenching the triplet exciton from the excited triplet energy level $T_1^{DF2}$ of the second delayed fluorescent material to the lowest excited state triplet energy level $T_1^{DF1}$ of the first delayed fluorescent material DF1. Accordingly, triplet exciton energy is accumulated at the second delayed fluorescent material DF2, and the possibility of generating the hot triplet exciton at the second delayed fluorescent DF2 is increased so that the luminous lifetime of the OLED D1 may be reduced.

On the contrary, when the contents of the second delayed fluorescent material DF2 is more than twice the contents of the first delayed fluorescent material DF1, exciton recombination may be occurred at the second delayed fluorescent material DF2. As a result, the second delayed fluorescent material DF2 as well as the first delayed fluorescent material DF1 can emit light. When the first and second delayed fluorescent materials DF1 and DF2 emit light simultaneously, FWHM of the luminescence spectrum becomes wide and color purity of the OLED D1 can be deteriorated.

In the above first aspect, the EML 240 includes the host and the first and second delayed fluorescent materials. Due to the bond conformation between the electron acceptor and the electron donor and sterically twists within the delayed fluorescent material, as described above, addition charge transfer transition (CT transition) is caused within the delayed fluorescent material. Since the delayed fluorescent material shows emission spectrum having very broad FWHM caused by the CT transition mechanism in the course of emission, which results in poor color purity. That is, since the delayed fluorescent material emits light by CT luminescence mechanism utilizing triplet exciton energy, its FWHM is very wide so that it has disadvantage in terms of color purity.

A hyper-fluorescence for solving the limitations accompanied by the delayed fluorescent material uses the delayed fluorescent material so as to raise a generation ratio of the singlet exciton in a fluorescent material which can use only singlet exciton. Since the delayed fluorescent material can utilize the triplet exciton energy as well as the singlet exciton energy, the fluorescent material can absorb the exciton energy released from the delayed fluorescent material, and then the exciton energy absorbed by the fluorescent material can be utilized in the luminescence process with generating 100% singlet exciton.

Figure 10:
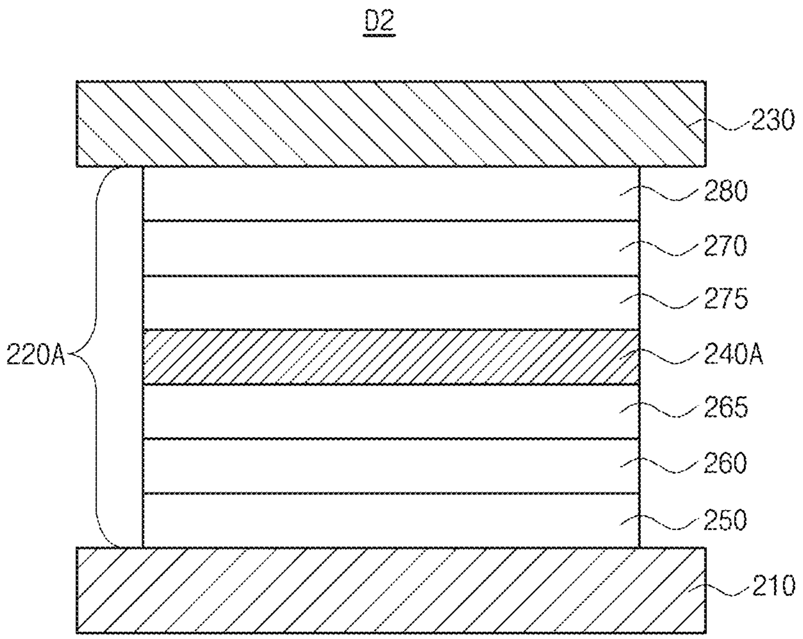
FIG. 10 is a schematic cross-sectional view illustrating an OLED in accordance with another exemplary aspect of the present disclosure.

FIG. 10 is a schematic cross-sectional view illustrating an OLED in accordance with another exemplary aspect of the present disclosure. As illustrated in FIG. 10, the OLED D2 comprises first and second electrodes 210 and 230 facing each other and an emissive layer 220A having single emitting unit disposed between the first and second electrodes 210 and 230. For example, the emissive layer 220A comprise an emitting material layer (EML) 240A. Also, the emissive layer 220A comprise the HIL 250 and the HTL 260 each of which is laminated sequentially between the first electrode 210 and the EML 240A, and the ETL 270 and the EIL 280 each of which is laminated sequentially between the EML 240A and the second electrode 230. Alternatively, the emissive layer 220A may further comprise the EBL 265 disposed between the HTL 260 and the EML 240A and/or the HBL 265 disposed between the EML 240A and the ETL 270. The configurations of the first and second electrodes 210 and 230 as well as other layers except the EML 240A in the emissive layer 220A is substantially identical to the corresponding electrodes and layers in the OLED D1.

The EML 240A comprise a first host H1, first and second delayed fluorescent materials DF1 and DF2 and fluorescent material F. In this case, it is important to adjust the energy levels among the luminous materials in order to transfer exciton energy efficiently.

As describe above, the first host H1 may be selected to have the HOMO energy level $HOMO^{H}$ equal to or deeper than the HOMO energy level $HOMO^{DF2}$ of the second delayed fluorescent material DF2, and the first delayed fluorescent material DF1 may be selected to have the HOMO energy level $HOMO^{DF1}$ shallower than the HOMO energy level $HOMO^{DF2}$ of the second delayed fluorescent material DF1. In addition, the first host H1 may be designed to have the LUMO energy level $LUMO^{H}$ shallower than each of the LUMO energy levels $LUMO^{DF1}$ and $LUMO^{DF2}$ of the first and second delayed fluorescent material DF1 and DF2 (see, FIG. 7). In addition, the first and second delayed fluorescent materials DF1 and DF2 and the HBL may be selected to have the excited triplet energy levels $T_1^{DF1}$ and $T_1^{DF2}$ and to have the LUMO energy levels $LUMO^{DF1}$, $LUMO^{DF2}$ and $LUMO^{HBL}$ each of which satisfy at least one of the conditions in Equations (1) to (6).

When the delayed fluorescent materials DF1 and DF2 satisfy the conditions in Equations (1) to (6) above, they are not limited to specific compounds. As an example, the first delayed fluorescent material DF1 may comprise, but is not limited to, any organic compound having the structure of Chemical Formulae 1 and 4, and the second delayed fluorescent material DF2 may comprise, but is not limited to, any organic compound having the structure of Chemical Formulae 2 and 5.

Figure 11:
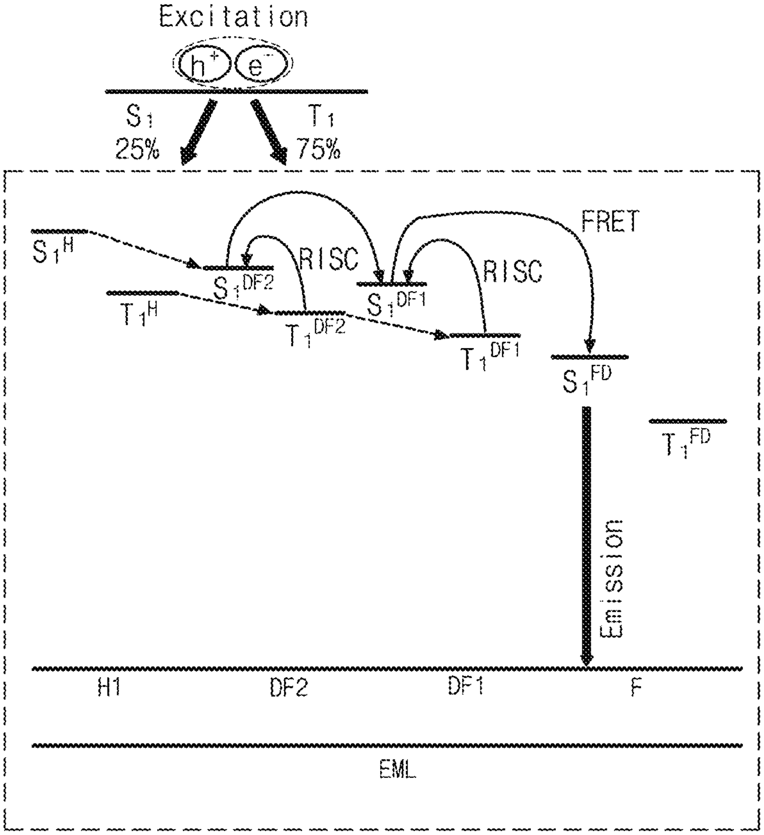
FIG. 11 is a schematic diagram illustrating luminous mechanism by energy level bandgap among a host, plural delayed fluorescent materials and fluorescent material in the EML in accordance with another exemplary aspect of the present disclosure.

FIG. 11 is a schematic diagram illustrating luminous mechanism by energy level bandgap among a host, plural delayed fluorescent materials and fluorescent material in the EML in accordance with another exemplary aspect of the present disclosure. As illustrated schematically in FIG. 11, the exciton energy generated in the first host H1 should be transferred rapidly to the first and second delayed fluorescent materials DF1 and DF2. To this end, each of the excited singlet energy level $S_1^{H}$ and the excited triplet energy level $T_1^{H}$ of the first host H1 is higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2, respectively.

In addition, the exciton energy should be transferred from the first delayed fluorescent material DF1, which is converted ICT complex state by RISC mechanism, to the fluorescent material F so that OLED D2 should have enhanced luminous efficiency and high color purity. In order to realize such luminescence properties, each of the excited singlet energy levels $S_1^{DF1}$ and $S_1^{DF2}$ is higher than an excited singlet energy level $S_1^{FD}$ of the fluorescent material F. If necessary, the excited triplet energy levels $T_1^{DF1}$ and $T_1^{DF2}$ of the first and second delayed fluorescent material may be higher than an excited triplet energy level $T_1^{FD}$ of the fluorescent material, respectively.

As an example, the fluorescent may include fluorescent material having narrow FWHM. For example, the first fluorescent material may be, but is not limited to, green color fluorescent material having less than about 40 nm of FWHM, such as between about 10 nm to about 40 nm of FWHM. In addition, fluorescent material, which has an absorption spectrum overlapped largely with an emission spectrum of the first host H1 and/or the first and/or second delayed fluorescent materials DF1 and DF2 and a wave function overlapped with a wave function of the first host H1 and/or the first and/or second delayed fluorescent materials DF1 and DF2, may be used as the fluorescent material F.

In this case, excessively generated exciton-exciton quenching or polaron-exciton quenching for forming excitons are minimized so that luminous efficiency may be maximized in the EML 240A and green emission having high color purity may be realized.

As an example, the fluorescent material F in the EML 240A may have a boron-dipyrromethene (BODIPY; 4,4-difluoro-4-bora-3a,4a-diaza-s-indacene) core and/or a quinolino-acridine core. As an example, the fluorescent material F may be selected from, but is not limited to, green fluorescent material having the BODIPY core (LGGD-FD1, LUMO: −3.5 eV; HOMO: −5.8 eV), green fluorescent material having the quinolino-acridine core such as 5,12-dimethylquinolino(2,3-b)acridine-7,14(5H, 12H)-dione (LUMO: −3.0 eV; HOMO: −5.4 eV), 5,12-diethylquinolino(2,3-b)acridine-7,14(5H, 12H)-dione (LUMO: −3.0 eV; HOMO: −5.4 eV), 5,12-dibutyl-3,10-difluoroquinolino(2,3-b)acridine-7,14(5H, 12H)-dione (LUMO: −3.1 eV; HOMO: −5.5 eV), 5,12-dibutyl-3,10-bis(trifluromethyl)quinolino(2,3-b)acridine-7,14(5H, 12H)-dione (LUMO: −3.1 eV; HOMO: −5.5 eV), 1,1,7,7-tetramethyl-2,3,6,7-tetrahydro-1H,5H-benzo[ij]quinolizin-9-yl)ethenyl]-4H-pyran-4-ylidene}propanedinitrile (DCJTB; LUMO: −3.1 eV; HOMO: −5.3 eV), and combination thereof.

When the EML 240A includes the first and second delayed fluorescent materials DF1 and DF2 and the fluorescent material F, each of the first and second delayed fluorescent material DF1 and DF2 may be doped with, but is not limited to, about 10 wt % to about 40 wt % in the EML 240A, respectively. The contents of the second delayed fluorescent material DF2 may be, but is not limited to, more than or equal to the content of the first delayed fluorescent material DF1 and less than or equal to twice the contents of the first delayed fluorescent material DF1. In addition, the fluorescent material F may be doped with, but is not limited to, about 1 wt % to about 5 wt % in the EML 240A.

In accordance with this exemplary aspect, the EML 240A further includes the fluorescent material F having narrow FWHM in order to prevent color purity being deteriorated in case of using only using the first and second delayed materials DF1 and DF2. The triplet exciton energy of the first delayed fluorescent material DF1 is converted to its own singlet exciton energy by RISC mechanism, then the converted singlet exciton energy of the first delayed fluorescent material DF1 can be transferred to the fluorescent material F within the same EML 240A by FRET mechanism. As the exciton energy is transferred from the first delayed fluorescent material DF1 to the fluorescent material F having narrow FWHM at which ultimate light emission is occurred as the transferred exciton energy is shifted to the ground state. Accordingly, the OLED D2 can enhance its luminous efficiency and luminous lifetime and improve its color purity.

Figure 12:
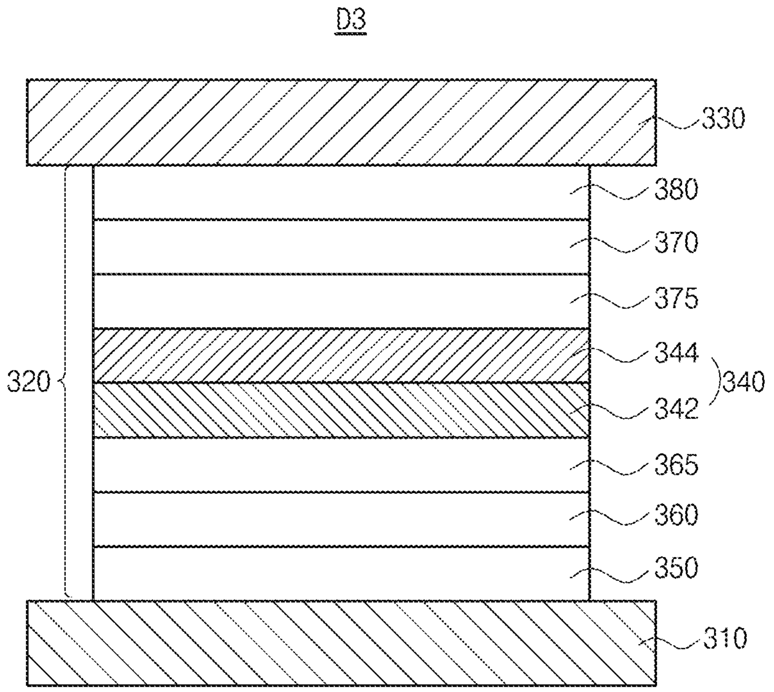
FIG. 12 is a schematic cross-sectional view illustrating an OLED in accordance with another exemplary aspect of the present disclosure.
Figure 13:
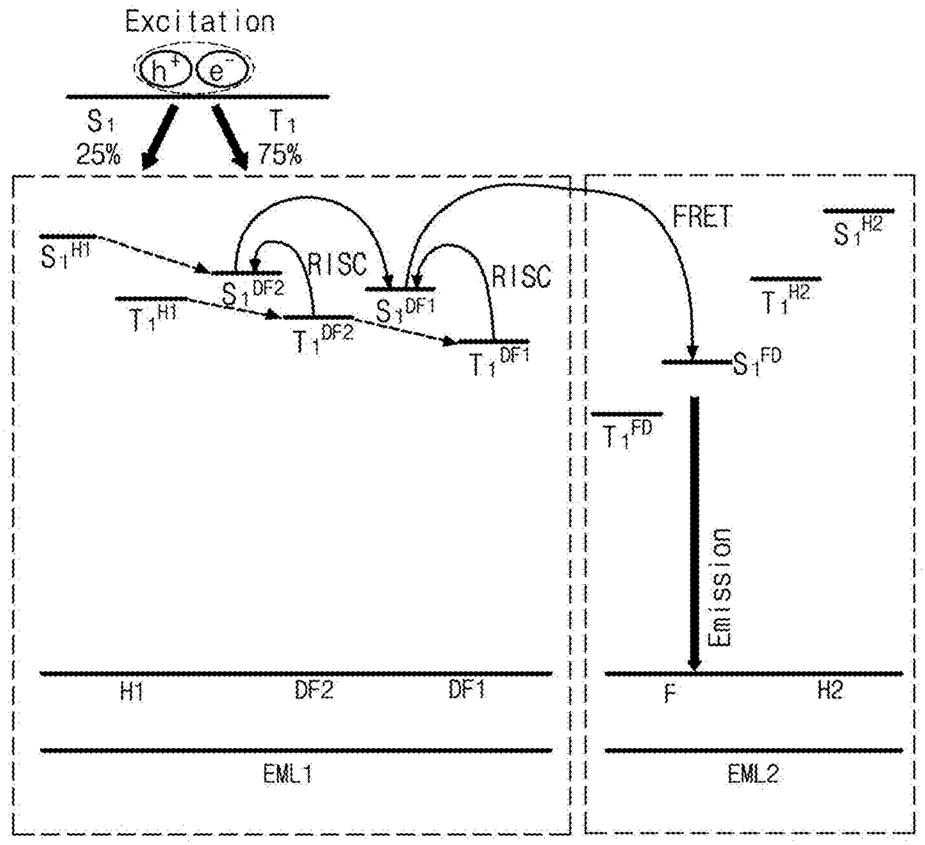
FIG. 13 is a schematic diagram illustrating luminous mechanism by energy level bandgap among hosts, plural delayed fluorescent materials and fluorescent material in two EMLs in accordance with another exemplary aspect of the present disclosure.

In the above aspects, the OLEDs D1 and D2 have a single-layered EML 240 or 240A. Alternatively, an OLED in accordance with the present disclosure may include a multiple-layered EML. FIG. 12 is a schematic cross-sectional view illustrating an OLED in accordance with another exemplary aspect of the present disclosure. FIG. 13 is a schematic diagram illustrating luminous mechanism by energy level bandgap among hosts, plural delayed fluorescent materials and fluorescent material in two EMLs in accordance with another exemplary aspect of the present disclosure.

As illustrated in FIG. 12, an OLED D3 in accordance with an exemplary third aspect of the present disclosure includes first and second electrodes 310 and 330 facing each other and an emissive layer 320 having single emitting unit disposed between the first and second electrodes 310 and 330.

In one exemplary aspect, the emissive layer 320 comprises an EML 340 having two-layered structure. Also, the emissive layer 320 may further comprise an HIL 350 and an HTL 360 each of which is laminated sequentially laminated between the first electrode 310 and the EML 340, and an ETL 370 and an EIL 380 each of which laminated sequentially between the EML 340 and the second electrode 330. Also, the emissive layer 320 may further comprise an EBL 365 as a first exciton blocking layer disposed between the HTL 360 and the EML 340 and a HBL 375 as a second exciton blocking layer disposed between the EML 340 and the ETL 370.

The first electrode 310 may be an anode and may include, but is not limited to, a conductive material having a relatively large work function values such as ITO, IZO, SnO, ZnO, ICO, AZO, and the like. The second electrode 330 may be a cathode and may include, but is not limited to, a conductive material having a relatively small work function values such as Al, Mg, Ca, Ag, alloy thereof or combination thereof.

The HIL 350 is disposed between the first electrode 310 and the HTL 360. The HIL 350 may include, but is not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 350 may be omitted in compliance with the structure of the OLED D3.

The HTL 360 is disposed adjacently to the EML 340 between the first electrode 310 and the EML 340. The HTL 360 may include, but is not limited to, aromatic amine compounds such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EBL 365 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB and/or 3,6-bis(N-carbazolyl)-N-phenyl-carbazole.

The EML 340 includes a first EML (EML1) 342 and a second EML (EML2) 344. The EML1 342 is disposed between the EBL 365 and the HBL 375 and the EML2 344 is disposed between the EML1 342 and the HBL 375. The configuration and energy levels among the luminous materials in the EML 340 will be explained in more detail below.

The HBL 375 may include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 375 may include a compound having a relatively low HOMO energy level compared to the emitting material in the EML 340. The HBL 375 may include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole and combination thereof.

The ETL 370 is disposed between the HBL 375 and the EIL 380. As an example, the ETL 370 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like. For Example, the ETL 370 may include, but is not limited to, $Alq_3$, PBD, spiro-PBD, Liq, TPBi, BAlq, Bphen, NBphen, BCP, TAZ, NTAZ, TpPyPB, TmPPPyTz, PFNBr and/or TPQ.

The EIL 380 is disposed between the ETL 370 and the second electrode 330. As an example, the EIL 380 may include, but is not limited to, an alkali metal halide and/or alkaline earth metal halide such as LiF, CsF, NaF, $BaF_2$ and the like, and/or an organic metal compound such as lithium benzoate, sodium stearate, and the like.

As described above, the EML 340 includes the EML1 342 and the EML2 344. One of the EML1 344 and the EML2 344 includes the first host H1 and the first and second delayed fluorescent materials DF1 and DF2, and the other of the EML1 342 and the EML2 344 includes a second host H2 and the fluorescent material F. Hereinafter, the EML 340, where the EML1 342 includes the delayed fluorescent materials DF1 and DF2 and the EML2 344 includes fluorescent material F, will be explained.

In accordance with an exemplary third aspect, the EML1 342 includes the first host H1 and the first and second delayed fluorescent materials DF1 and DF2. As described above, two delayed fluorescent materials DF1 and DF2 having different triplet energy levels, HOMO energy levels and LUMO energy levels can be applied into the EML1 342 to improve its luminous efficiency and its luminescence lifetime. While the delayed fluorescent materials shows high quantum efficiency, but they have poor color purity due to its wide FWHM.

The EML2 344 includes the second host H2 and the fluorescent material F. While the fluorescent material F has an advantage in terms of color purity due to its narrow FWHM, but it has a disadvantage in terms of quantum efficiency because its triplet exciton cannot participate in the luminescence process.

But, in this exemplary aspect, the singlet exciton energies and the triplet exciton energies of the first and second delayed fluorescent materials DF1 and DF2 in the EML1 342 can be transferred to the fluorescent material F in the EML2 344 disposed adjacently to the EML1 344 by FRET mechanism, which transfers energy non-radially through electrical fields by dipole-dipole interactions. Accordingly, the ultimate emission occurs in the fluorescent material F in the EML2 344.

The triplet exciton energy of the first delayed fluorescent material DF1 is converted to its own singlet exciton energy by RISC mechanism in the EML1 342, then the converted singlet exciton energy of the first delayed fluorescent material DF1 is transferred to the singlet exciton energy of the fluorescent material F in the EML2 344 because the excited singlet energy level $S_1^{DF1}$ of the first delayed fluorescent material in the EML1 342 is higher than the excited singlet energy level $S_1^{FD}$ of the fluorescent material F in the EML2 344 (see, FIG. 13).

The fluorescent material F in the EML2344 can emit light using the triplet exciton energy as well as the singlet exciton energy transferred from the first delayed fluorescent material DF1. In addition, the fluorescent material F has relatively narrow FWHM as compared with the delayed fluorescent materials DF1 and DF2. As a result, the OLED D3 can enhance its luminous efficiency and color purity. Particularly, an organic compound as the fluorescent material F in the EML2 344 can emit green light having high color purity. As the exciton energy generated at the first delayed fluorescent material DF1 in the EML1 342 is transferred efficiently to the fluorescent material F in the EML2 344, the OLED D3 can implement hyper-fluorescence.

Each of the first and second delayed fluorescent materials DF1 and DF2 acts as only transferring exciton energy to the fluorescent material F. Accordingly, the EML1 342 including the delayed fluorescent materials DF1 and DF2 is not involved in the ultimate luminescence process, but the ultimate luminescence is occurred in the EML2 344 including the fluorescent material F.

Each of the EML1 342 and the EML2 344 includes the first host H1 and the second host H2, respectively. For example, each of the first and second hosts H1 and H2 may independently include, but is not limited to, mCP-CN, CBP, mCBP, mCP, DPEPO, PPT, TmPyPB, PYD-2CZ, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent materials DF1 and DF2 that may be included in the EML1 342 is not particularly limited as long as they satisfy the above-mentioned relationships in Equations (1) to (6). As an example, the first delayed fluorescent material DF1 may include anyone having the structure of Chemical Formulae 1 and 4, and the second delayed fluorescent material DF2 may include anyone having the structure of Chemical Formulae 2 and 5.

The fluorescent material F that may be included in the EML2 344 may have the BODIPY core and/or the quinolino-acridine core. As an example, the fluorescent material F may be selected from, but is not limited to, the green fluorescent material (LGGD-FD1) having the BODIPY core, the organic compound having the quinolino-acridine core such as 5,12-dimethylquinolino(2,3-b)acridine-7,14(5H, 12H)-dione, 5,12-diethylquinolino(2,3-b)acridine-7,14(5H, 12H)-dione, 5,12-dibutyl-3,10-difluoroquinolino(2,3-b)acridine-7,14(5H, 12H)-dione, 5,12-dibutyl-3,10-bis(trifluromethyl)quinolino(2,3-b)acridine-7,14(5H, 12H)-dione, DCJTB, and combination thereof.

For example, each of the first and second delayed fluorescent materials DF1 and DF2 may be doped with, but is not limited to, about 10 wt % to about 40 wt % in the EML1 342, respectively. The contents of the second delayed fluorescent material DF2 may be, but is not limited to, more than or equal to the content of the first delayed fluorescent material DF1 and less than or equal to twice the contents of the first delayed fluorescent material DF1 in the EML1 342. In addition, the contents of the first delayed fluorescent material DF1 in the EML1 342 may be more than the contents of the fluorescent material F in the EML2 344. In this case, it is possible to transfer enough energy from the first delayed fluorescent material DF1 in the EML1 342 to the fluorescent material F in the EML2 344. For example, the fluorescent material F may be doped with, but is not limited to, about 1 wt % to about 30 wt %, preferably about 1 wt % to about 10 wt % in the EML2 344.

Now, we will describe the energy level relationships among the luminous materials in the EML 340 that comprises the EML1 342 and EML2 344 with referring to FIG. 13. As illustrated in FIG. 13, each of the excited singlet energy level $S_1^{H1}$ and an excited triplet energy level $T_1^{H1}$ of the first host H1 is higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2 in the EML1 342, respectively. Alternatively, each of an excited singlet energy level $S_1^{H2}$ and an excited triplet energy level $T_1^{H2}$ of the second host H2 in the EML2 344 may be higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2 in the EML1 342, respectively.

In addition, each of the excited singlet energy levels $S_1^{DF1}$ and $S_1^{DF2}$ of the first and second delayed fluorescent materials DF1 and DF2 in the EML1 342 is higher than each of the excited singlet energy level $S_1^{FD}$ of the fluorescent material F in the EML2 344, respectively. If necessary, each of the excited triplet energy levels $T_1^{DF1}$ and $T_1^{DF2}$ of the first and second delayed fluorescent materials DF1 and DF2 in the EML1 342 may be higher than the excited triplet energy level $T_1^{FD}$ of the fluorescent material F in the EML2 344, respectively. Moreover, each of the excited singlet energy level $S_1^{H2}$ and/or the excited triplet energy level $T_1^{H2}$ of the second host H2 may be higher than each of the excited singlet energy level $S_1^{FD}$ and the excited triplet energy level $T_1^{FD}$ of the fluorescent material F in the EML2 344, respectively.

When the luminous materials do not satisfy the above-described energy level relationships, exciton quenching as non-emission exciton annihilation may occur at the delayed fluorescent materials DF1 and DF2 and/or the fluorescent materials F, or exciton energy cannot be transferred efficiently from the hosts H1 and H2 to the delayed fluorescent materials DF1 and DF2 or the fluorescent material F so that luminous efficiency of the OLED D3 may be deteriorated.

In an alternatively exemplary aspect, the second host H2, which is included in the EML2344 together with the fluorescent material F, may be the same material as the HBL 375. In this case, the EML2344 may have a hole blocking function as well as an emission function. In other words, the EML2344 can act as a buffer layer for blocking holes. In one aspect, the HBL 375 may be omitted where the EML2344 may be a hole blocking layer as well as an emitting material layer.

In another exemplary aspect, the EML1 342 may include the second host H2 and the fluorescent material F and the EML2 344 may include the first host H1 and the first and second delayed fluorescent materials DF1 and DF2. In this aspect, the second host H2 in the EML1342 may be the same material as the EBL 365. In this case, the EML1342 may have an electron blocking function as well as an emission function. In other words, the EML1342 can act as a buffer layer for blocking electrons. In one aspect, the EBL 365 may be omitted where the EML1342 may be an electron blocking layer as well as an emitting material layer.

Figure 14:
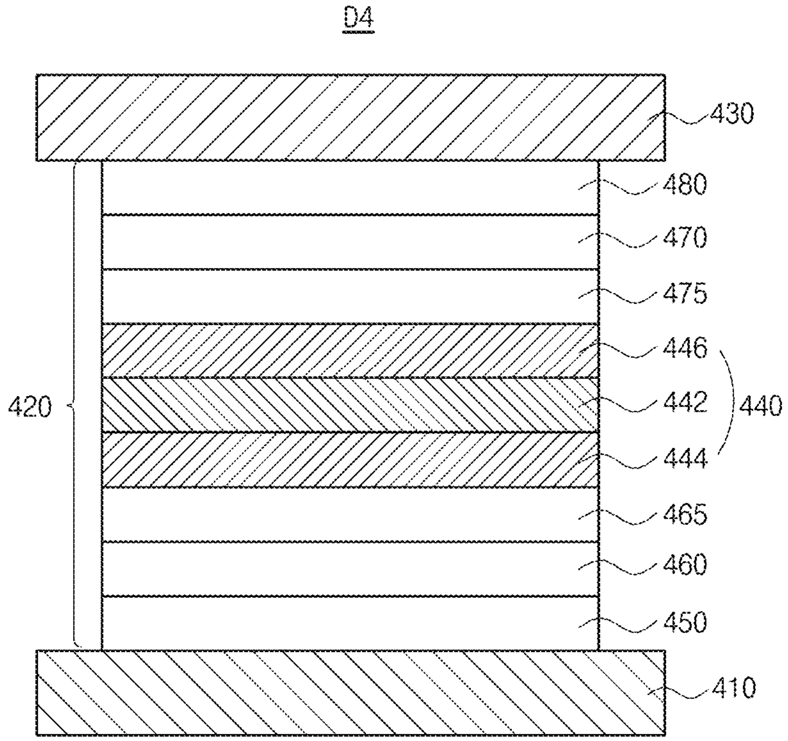
FIG. 14 is a schematic cross-sectional view illustrating an OLED in accordance with still another exemplary aspect of the present disclosure.
Figure 15:
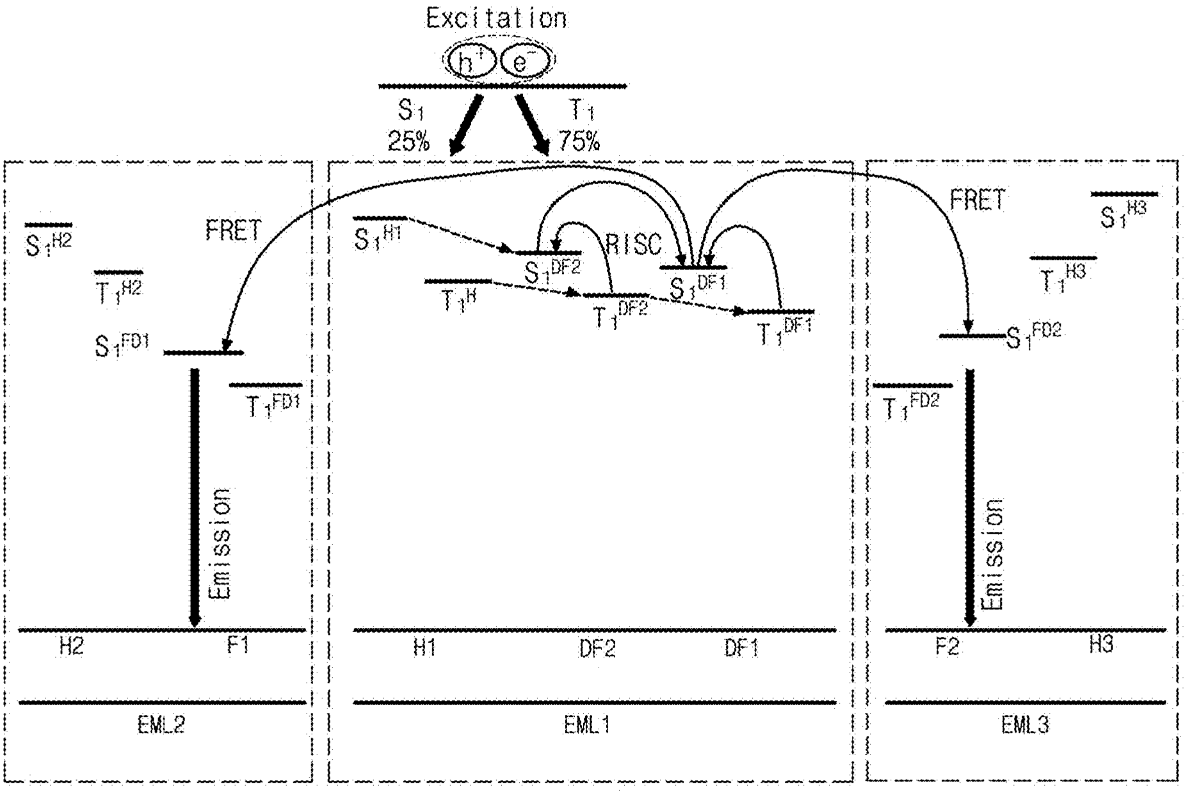
FIG. 15 is a schematic diagram illustrating luminous mechanism by energy level bandgap among hosts, plural delayed fluorescent materials and fluorescent materials in three EMLs in accordance with still another exemplary aspect of the present disclosure.

An OLED having a triple-layered EML will be explained. FIG. 14 is a schematic cross-sectional view illustrating an OLED in accordance with still another exemplary aspect of the present disclosure. FIG. 15 is a schematic diagram illustrating luminous mechanism by energy level bandgap among hosts, plural delayed fluorescent materials and fluorescent materials in three EMLs in accordance with still another exemplary aspect of the present disclosure.

As illustrated in FIG. 14, an OLED D4 in accordance with fourth aspect of the present disclosure includes first and second electrodes d electrodes 410 and 430 facing each other and an emissive layer 420 having single emitting unit disposed between the first and second electrodes 410 and 430.

In one exemplary aspect, the emissive layer 420 comprises an EML 440 having three-layered structure. Also, the emissive layer 420 may further comprise an HIL 450 and an HTL 460 each of which is laminated sequentially laminated between the first electrode 410 and the EML 440, and an ETL 470 and an EIL 480 each of which laminated sequentially between the EML 440 and the second electrode 430. Also, the emissive layer 420 may further comprise an EBL 465 as a first exciton blocking layer disposed between the HTL 460 and the EML 340 and a HBL 475 as a second exciton blocking layer disposed between the EML 440 and the ETL 470.

The configuration of the first and second electrodes 410 and 420 as well as other layers except the EML 440 in the emissive layer 420 is substantially identical to the corresponding electrodes and the layers in the OLEDs D1, D2 and D3.

The EML 440 includes a first EML (EML1) 442 disposed between the EBL 465 and the HBL 475, a second EML (EML2) 444 disposed between the EBL 465 and the EML1 442, and a third EML (EML3) 446 disposed between the EML1 442 and the HBL 475. The EML1 442 includes first and second delayed fluorescent materials DF1 and DF2 and each of the EML2 444 and EML3 446 includes a first fluorescent material F1 and a second fluorescent material F2, respectively. Each of the EML1 442, the EML2 444 and the EML3 446 further include a first host H1, a second host H2 and a third host H3, respectively.

In accordance with this aspect, the singlet and triplet exciton energies of the first delayed fluorescent material DF1 in the EML1 442, is transferred to the first and second fluorescent materials F1 and F2 each of which is included in the EML2444 and EML3 446 disposed adjacently to the EML1442 by FRET energy transfer mechanism. Accordingly, the ultimate emission occurs in the first and second fluorescent materials F1 and F2 in the EML2444 and the EML3 446.

In other words, the triplet exciton energy of the first delayed fluorescent material DF1 is converted to its own singlet exciton energy in the EML1 442 by RISC mechanism, then the singlet exciton energy of the first delayed fluorescent material DF1 is transferred to each of the singlet exciton energy of the first and second fluorescent materials F 1 and F2 because the excited singlet energy level $S_1^{DF1}$ of the first delayed fluorescent material DF1 is higher than each of the excited singlet energy levels $S_1^{FD1}$ and $S_1^{FD2}$ of the first and second fluorescent materials F1 and F2 (see, FIG. 15). The first and second fluorescent materials F1 and F2 in the EML2444 and EML3 446 can emit light using the singlet and triplet exciton energies derived from the first delayed fluorescent material DF1. Therefore, the OLED D4 can enhance its luminous efficiency and color purity owing to the narrow FWHM of the first and second fluorescent materials F1 and F2.

In this case, the first and second delayed fluorescent materials DF1 and DF2 only act as transferring energy to the first and second fluorescent materials F1 and F2. The EML1 442 including the delayed fluorescent materials DF1 and DF2 is not involved in the ultimate luminescence process, while both the EML2444 including the first fluorescent material F1 and the EML3 446 including the second fluorescent material F2 emit light. Since the fluorescent materials F 1 and F2 have relatively narrow FWHM as compared with the delayed fluorescent materials DF1 and DF2, the OLED D4 can enhance its luminous efficiency and color purity.

In addition, each of the EML1 442, the EML2 444 and the EML3 446 may include the first host H1, the second host H2 and the third host H3, respectively. The first to third hosts H1 to H3 are the same as or different from one another. As an example, each of the first to third host H1 to H3 may independently include, but is not limited to, mCP-CN, CBP, mCBP, mCP, DPEPO, PPT, TmPyPB, PYD-2CZ, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyri din-3-yl)-9H-3,9'-bicarbazole.

Each of the first and second delayed fluorescent materials DF1 and DF2 in the EML1 442 is not particularly limited as long as they satisfy the above-mentioned relationships in Equations (1) to (6). As an example, the first delayed fluorescent material DF1 may include anyone having the structure of Chemical Formulae 1 and 4, and the second delayed fluorescent material DF2 may include anyone having the structure of Chemical Formulae 2 and 5.

Each of the first and second fluorescent materials F1 and F2 that may be included in the EML2 444 and in the EML3 446 may have the BODIPY core and/or the quinolino-acridine core. As an example, each of the first and second fluorescent materials F1 and F2 may be selected from, but is not limited to, the green fluorescent material (LGGD-FD1) having the BODIPY core, the organic compound having the quinolino-acridine core such as 5,12-dimethylquinolino(2,3-b)acridine-7,14(5H, 12H)-dione, 5,12-diethylquinolino(2,3-b)acridine-7,14(5H, 12H)-dione, 5,12-dibutyl-3,10-difluoroquinolino(2,3-b)acridine-7,14(5H, 12H)-dione, 5,12-dibutyl-3,10-bis(trifluromethyl)quinolino(2,3-b)acridine-7,14(5H, 12H)-dione, DCJTB, and combination thereof.

For example, each of the first and second delayed fluorescent materials DF1 and DF2 may be doped with, but is not limited to, about 10 wt % to about 40 wt % in the EML1 442, respectively. The contents of the second delayed fluorescent material DF2 may be, but is not limited to, more than or equal to the content of the first delayed fluorescent material DF1 and less than or equal to twice the contents of the first delayed fluorescent material DF1 in the EML1 442. In addition, the contents of the first delayed fluorescent material DF1 in the EML1 442 may be more than each of the contents of the first and second fluorescent materials F1 and F2 in the EML2 444 and in the EML 446. In this case, it is possible to transfer enough energy from the first delayed fluorescent material DF1 in the EML1 442 to the first and second fluorescent materials F1 and F2 in the EML2 444 and the EML3 446. For example, each of the first and second fluorescent materials F1 and F2 may be doped with, but is not limited to, about 1 wt % to about 30 wt %, preferably about 1 wt % to about 10 wt % in the EML2 444 or in the EML3 446.

Now, we will describe the energy level relationships among the luminous materials in the EML 440 that comprises the EML1 442, the EML2 442 and the EML3 446 with referring to FIG. 15. As illustrated in FIG. 15, each of the excited singlet energy level $S_1^{H1}$ and an excited triplet energy level $T_1^{H1}$ of the first host H1 is higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2 in the EML1 442, respectively. Alternatively, each of excited singlet energy levels SP and SP and excited triplet energy levels $T_1^{H2}$ and $T_1^{H3}$ of the second and third hosts H2 and H3 in the EML2 444 and EML3 446 may be higher than each of the excited singlet energy levels $S_1^{DF1}$ and $S_1^{DF2}$ and the excited triplet energy levels $T_1^{DF1}$ and $T_1^{DF2}$ of the first and second delayed fluorescent materials DF1 and DF2 in the EML1 442, respectively.

In addition, each of the excited singlet energy levels $S_1^{DF1}$ and $S_1^{DF2}$ of the first and second delayed fluorescent materials DF1 and DF2 in the EML1 442 is higher than each of the excited singlet energy levels $S_1^{FD1}$ and $S_1^{FD2}$ of the first and second fluorescent materials F1 and F2 in the EML2 444 and in the EML3 446, respectively. If necessary, each of the excited triplet energy levels $T_1^{DF1}$ and $T_1^{DF2}$ of the first and second delayed fluorescent materials DF1 and DF2 in the EML1 442 may be higher than the excited triplet energy levels $T_1^{FD1}$ and $T_1^{FD2}$ of the first and second fluorescent materials F1 and F2 in the EML2 444 and in the EML3 446, respectively. Moreover, each of the excited singlet energy levels $S_1^{H2}$ and $S_1^{H3}$ and/or the excited triplet energy level $T_1^{H2}$ and $T_1^{H3}$ of the second and the third hosts H2 and H3 may be higher than each of the excited singlet energy levels $S_1^{FD}$ and $S_1^{FD2}$ and the excited triplet energy levels $T_1^{FD}$ and $T_1^{FD2}$ of the first and second fluorescent materials in the EML2 444 and in the EML3 446, respectively.

In an alternatively exemplary aspect, the second host H2, which is included in the EML2 444 together with the first fluorescent material F, may be the same material as the EBL 565. In this case, the EML2 444 may have an electron blocking function as well as an emission function. In other words, the EML2 444 can act as a buffer layer for blocking electrons. In one aspect, the EBL 465 may be omitted where the EML2 464 may be an electron blocking layer as well as an emitting material layer.

In another exemplary aspect, the third host H3, which is included in the EML3 446 together with the second fluorescent material F2, may be the same material as the HBL 475. In this case, the EML3 446 may have a hole blocking function as well as an emission function. In other words, the EML3 446 can act as a buffer layer for blocking holes. In one aspect, the HBL 475 may be omitted where the EML3 446 may be a hole blocking layer as well as an emitting material layer.

In still another exemplary aspect, the second host H2 in the EML2 444 may be the same material as the EBL 465 and the third host H3 in the EML3 446 may be the same material as the HBL 475. In this aspect, the EML2 444 may have an electron blocking function as well as an emission function, and the EML3 446 may have a hole blocking function as well as an emission function. In other words, each of the EML2 444 and the EML3 446 can act as a buffer layer for blocking electrons or hole, respectively. In one aspect, the EBL 465 and the HBL 475 may be omitted where the EML2 444 may be an electron blocking layer as well as an emitting material layer and the EML3 446 may be a hole blocking layer as well as an emitting material layer.

Figure 16:
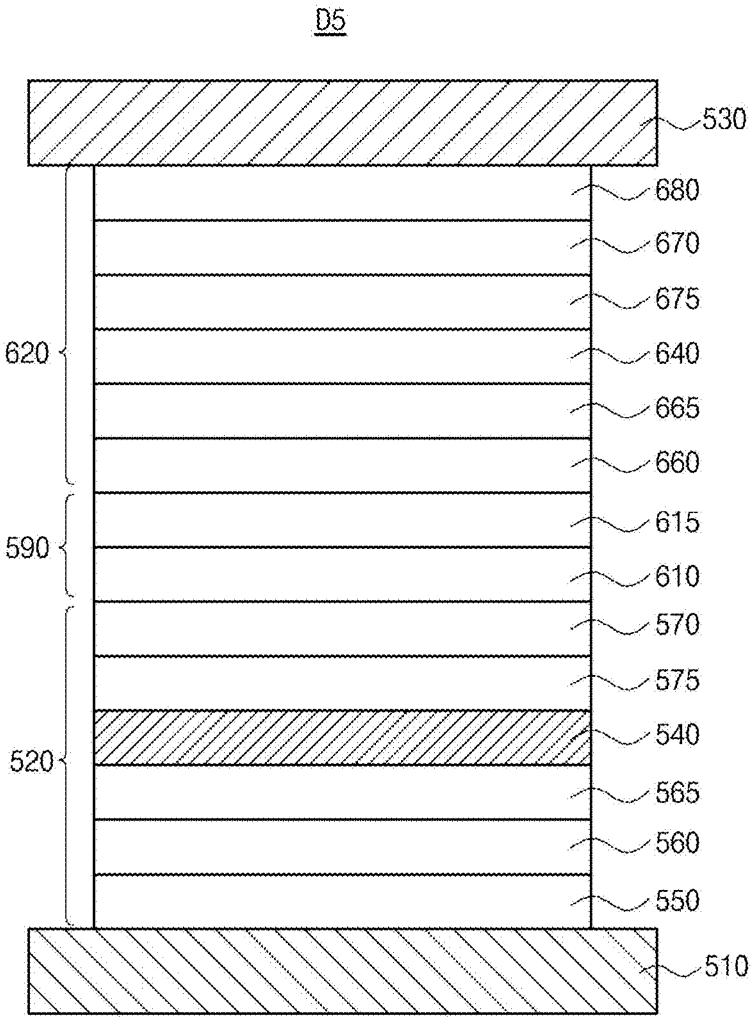
FIG. 16 is a schematic cross-sectional view illustrating an OLED in accordance with still another exemplary aspect of the present disclosure.

In the above aspects, the OLEDs having only one emitting unit are described. Unlike the above aspects, the OLED may have multiple emitting units so as to form a tandem structure. FIG. 16 is a cross-sectional view illustrating an OLED in accordance with still another aspect of the present disclosure.

As illustrated in FIG. 16, an OLED D5 in accordance with the fifth aspect of the present disclosure includes first and second electrodes 510 and 530 facing each other, a first emitting unit 520 disposed between the first and second electrodes 510 and 530, a second emitting unit 620 disposed between the first emitting unit 520 and the second electrode 530, and a charge generation layer (CGL) 590 disposed between the first and second emitting units 520 and 620.

The first electrode 510 may be an anode and include, but is not limited to, conductive material, for example, TCO having a relatively large work function values. As an example, the first electrode 510 may include, but is not limited to, ITO, IZO, SnO, ZnO, ICO, AZO, and the like. The second electrode 530 may be a cathode and may include, but is not limited to, a conductive material having a relatively small work function values such as Al, Mg, Ca, Ag, alloy thereof or combination thereof.

The first emitting unit 520 includes a lower EML 540. Also, the first emitting unit 520 includes a HIL 550 and a first HTL (HTL1) 560 each of which is laminated sequentially between the first electrode 510 and the lower EML 540, and a first ETL (ETL1) 570 laminated between the lower EML 540 and the CGL 590. Alternatively, the first emitting unit 520 may further include a first EBL (EBL1) 565 disposed between the HTL1 560 and the lower EML 540 and/or a first HBL (HBL1) 575 disposed between the lower EML 540 and the first ETL2 570.

The second emitting unit 620 includes an upper EML 640. The second emitting unit 620 includes a second HTL (HTL2) 660 laminated between the CGL 590 and the upper EML 640, and a second ETL (ETL2) 670 and an EIL 680 each of which is laminated sequentially between the upper EML 640 and the second electrode 530. Alternatively, the second emitting unit 620 may further comprise a second EBL (EBL2) 665 disposed between the HTL2 660 and the upper EML 640 and/or a second HBL (HBL2) 675 disposed between the upper EML 640 and the ETL2 670.

At least one of the lower EML 540 and the upper EML 640 may emit green (G) light. As an example, one of the lower and upper EMLs 540 and 640 may emit green light and the other of the lower and upper EMLs 540 and 640 may emit blue (B) and/or red (R) light. Hereinafter, the OLED D5, where the lower EML 540 emits green light and the upper EML 640 emits blue and/or red light, will be explained.

The HIL 550 is disposed between the first electrode 510 and the HTL1560 and improves an interface property between the inorganic first electrode 510 and the organic HTL1 560. In one exemplary aspect, the HIL 550 may include, but is not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 550 may be omitted in compliance with a structure of the OLED D5.

Each of the HTL1560 and the HTL2 660 may independently include, but is not limited to, TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl) phenyl)biphenyl-4-amine.

Each of the ETL1570 and the ETL2 670 facilitates electron transportations in the first emitting unit 520 and the second emitting unit 620, respectively. Each of the ETL1570 and the ETL2 670 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like, respectively. As an example, each of the ETL1570 and the ETL2 670 may independently include, but is not limited to, $Alq_3$, PBD, spiro-PBD, Liq, TPBi, BAlq, Bphen, NBphen, BCP, TAZ, NTAZ, TpPyPB, TmPPPyTz, PFNBr and/or TPQ, respectively.

The EIL 680 is disposed between the second electrode 530 and the ETL2670, and can improve physical properties of the second electrode 530 and therefore, can enhance the lifetime of the OLED D5. In one exemplary aspect, the EIL 580 may include, but is not limited to, an alkali metal halide and/or alkaline earth metal halide such as LiF, CsF, NaF, $BaF_2$ and the like, and/or an organic metal compound such as lithium benzoate, sodium stearate, and the like.

Each of the EBL1 565 and the EBL2 665 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole, respectively.

Each of the HBL1575 and the HBL2 675 may independently include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the HBL1575 and the HBL2675 may independently include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole and combination thereof, respectively.

When the upper EML 640 emits blue light, the upper EML 640 may comprise a blue host. The blue host may comprise, but is not limited to, mCP, mCP-CN, mCBP, CBP-CN, 9-(3-(9H-Carbazol-9-yl)phenyl)-3-(diphenylphosphoryl)-9H-carbazole (mCPPO1), 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenyl silyl)benzene (UGH-2), 1,3-Bis(triphenyl silyl)benzene (UGH-3), 9,9-Spiorobifluoren-2-yl-diphenyl-phosphine oxide (SPPO1), 9,9'-(5-(Triphenylsilyl)-1,3-phenylene)bis(9H-carbazole) (SimCP), and the like.

In addition, the upper EML 640 may further comprise delayed fluorescent material and/or phosphorescent or fluorescent material each of which emits blue light. For example, blue-emitting delayed fluorescent material may include, but is not limited to, 10-(4-(diphenylphosphoryl) phenyl)-10H-phenoxazine 10'-4,4'-(phenylphosphoryl)bis (4,1-phenylene))bis(10H-penoxazine (DPXZPO), 10,10',10"-(4,4',4"-phosphoryltris(benzene-4,1-diyl))tris(10H-phenoxazine (TPXZPO), 9,9'-(5-(4,6-diphenyl-1,3,5-triazin-2-yl)-1,3-phenylene)bis(9H-carbazole) (DcZTrz), 9,9',9",9'"-((6-phenyl-1,3,5-triazin-2,4-diyl)bis(benzene-5,3,1-triyl))tetrakis(9H-carbazole) (DDczTrz), 2,7-bis(9,9-dimethylacridin-10(9H)-yl)-9,9-dimethyl-9H-thioxanthene-10,10-dioxide (DMTDAc), 9,9'-(4,4'-sulfonylbis(4,1-phenylene))bis(3,6-dimethoxyl-9H-carbazole) (DMOC-DPS), 10,10'-(4,4'-Sulfonylbis(4,1-phenylene))bis(9,9-dimethyl-9,10-dihydroacridine (DMAC-DPS), 10-(4-(4,6-diphenyl-1,3,5-triazin-2-yl)phenyl)-9,9-dimethyl-9,10-dihydroacridine (DMAC-TRZ), 10-phenyl-10H,10'H-spiro [acridine-9,9'-anthracen]-10'-one (ACRSA), 3,6-dibenzoyl-4,5-di(1-methyl-9-phenyl-9H-carbazoyl)-2-ethynylbenzonitrile (Cz-VPN), 9,9',9"-(5-(4,6-diphenyl-1,3,5-triazin-2-yl)benzene-1,2,3-triyl) tris(9H-carbazole) (TcZTrz), 2'-(10H-phenoxazine-10-yl)-[1,1':3',1"-terphenyl]-5'-carbonitrile (mPTC), bis(4-(9H-3,9'-bicarbazol-9-yl) phenyl)methanone (CC2BP), 9'-[4-(4,6-diphenyl-1,3,5-triazin-2-yl)phenyl]-3,3",6,6"-tetraphenyl-9,3':6',9"-ter-9H-carbazole (BDPCC-TPTA), 9'-[4-(4,6-diphenyl-1,3,5-triazin-2-yl)phenyl]-9,3':6',9"-ter-9H-carbazole (BCC-TPTA), 9-(4-(4,6-diphenyl-1,3,5-triazin-2-yl)phenyl)-3',6'-diphenyl-9H-3,9'-bicarbazole (DPCC-TPTA), 110-(4,6-diphenyl-1,3,5-triazin-2-yl)-10H-phenoxazine (Phen-TRZ), 9-(4-(4,6-diphenyl-1,3,5-triazin-2-yl)phenyl)-9H-carbazole (Cab-Ph-TRZ), 10-(4-(4,6-diphenyl-1,3,5-triazin-2-yl)phenyl)-10H-spiro[acridine-9,9'-fluorene] (SpiroAC-TRZ), 4,6-di(9H-carbazol-9-yl)isophthalonitrile (DczIPN), 3CzFCN, 2,3,4,6-tetra(9H-carbazol-9-yl)-5-fluorobenzonitrile (4CzFCN) and combination thereof.

Alternatively, when the upper EML 640 emits red light, the upper EML 640 may comprise the host (first to third hosts) as described above. In this case, the upper EML 640 may further comprise delayed fluorescent material and/or phosphorescent or fluorescent material each of which emits red light. For example, the red-emitting delayed fluorescent material may include, but is not limited to, 1,3-bis[4-(10H-phenoxazin-10-yl)benzoyl]benzene (mPx2BBP), 2,3,5,6-tetrakis(3,6-diphenylcarbazol-9-yl)-1,4-dicyanobenzene (4CzTPN-Ph), 10,10'-(sulfonylbis(4,1-phenylene))bis(5-phenyl-5,10-dihydrophenazine) (PPZ-DPS), 5,10-bis(4-(benzo[d]thiazol-2-yl)phenyl)-5,10-dihydrophenazine (DHPZ-2BTZ), 5,10-bis(4-(4,6-diphenyl-1,3,5-triazin-2-yl) phenyl)-5,10-dihydrophenazine (DHPZ-2TRZ), 7,10-bis(4-(diphenylamino)phenyl)-2,3-dicyanopyrazino phenanathrene; TPA-DCPP) and combination thereof.

The CGL 590 is disposed between the first emitting unit 520 and the second emitting unit 620. The CGL 590 includes an N-type CGL 610 disposed adjacently to the first emitting unit 520 and a P-type CGL 615 disposed adjacently to the second emitting unit 620. The N-type CGL 610 injects electrons into the first emitting unit 520 and the P-type CGL 615 injects holes into the second emitting unit 620.

As an example, the N-type CGL 610 may be an organic layer doped with an alkali metal such as Li, Na, K and/or Cs and/or an alkaline earth metal such as Mg, Sr, Ba and/or Ra. For example, a host used in the N-type CGL 610 may include, but is not limited to, an organic compound such as Bphen or MTDATA. The alkali metal or the alkaline earth metal may be doped with about 0.01 wt % to about 30 wt %.

The P-type CGL 615 may include, but is not limited to, an inorganic material selected from the group consisting of tungsten oxide ($WO_x$), molybdenum oxide ($MoO_x$), beryllium oxide ($Be_2O_3$), vanadium oxide ($V_2O_5$) and combination thereof, and/or an organic material selected from the group consisting of NPD, HAT-CN, 2,3,5,6-Tetrafluoro-7,7,8,8-tetracyanoquinodimethane (F4TCNQ), TPD, N,N,N',N'-Tetranaphthalenyl-benzidine (TNB), TCTA, N,N'-dioctyl-3,4,9,10-perylenedicarboximide (PTCDI-C8) and combination thereof.

The lower EML 540 includes a first host H1, a first delayed fluorescent material DF1 and a second delayed fluorescent material DF2 similar to the EML 240 in FIG. 2. The first host H1 may include, but is not limited to, mCP-CN, CBP, mCBP, mCP, DPEPO, PPT, TmPyPB, PYD-2CZ, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent materials DF1 and DF2 that may be included in the upper EML 540 is not particularly limited as long as they satisfy the above-mentioned relationships in Equations (1) to (6). As an example, the first delayed fluorescent material DF1 may include anyone having the structure of Chemical Formulae 1 and 4, and the second delayed fluorescent material DF2 may include anyone having the structure of Chemical Formulae 2 and 5.

Similar to the first aspect, the singlet exciton energy generated at the first host H1 can be transferred to the first delayed fluorescent material DF1 in the lower EML 540. Each of the singlet energy level $S_1^{H1}$ and the triplet energy level $T_1^{H1}$ of the first host is higher than each of the singlet energy levels $S_1^{DF1}$ and $S_1^{DF2}$ and the triplet energy levels $T_1^{DF1}$ and $T_1^{DF2}$ of the first and second delayed fluorescent materials DF1 and DF2, respectively (see, FIG. 9).

The lower EML 540 implements fluorescent emission as the singlet exciton energy transferred from the first host H1 to the first delayed fluorescent material DF1 is shifted to the ground state. In addition, the lower EML 540 implements delayed fluorescent emission as the triplet exciton energy of the first delayed fluorescent material DF1 is converted to its own singlet exciton energy by RISC mechanism, and then the converted singlet exciton energy is shifted to the ground state.

In an alternative aspect, the lower EML 540 may have a single-layered structure as illustrated in FIGS. 10 and 11. In this case, the lower EML 540 may include the first host H1, first and second delayed materials DF1 and DF2 and fluorescent material F. In another exemplary aspect, the lower EML 540 may have double-layered structure as illustrated in FIGS. 12 and 13. In this case, the lower EML 540 may include a first EML and a second EML. The first EML may include the first host H1 and the first and second delayed fluorescent materials DF1 and DF2 and the second EML may include the second host H2 and the fluorescent material F. In still another exemplary aspect, the lower EML 540 may have triple-layered structure as illustrated in FIGS. 14 and 15. In this case, the lower EML 540 may include a first EML, a second EML and a third EML. The first EML may include the first host H1 and the first and second delayed fluorescent materials DF1 and DF2, the second EML may include the second host H2 and the first fluorescent material F1, and the third EML may include the third host H3 and the second fluorescent material F2.

In still another exemplary aspect, an OLED of the present disclosure may further includes a third emitting unit disposed between the second emitting unit 620 and the second electrode 530 and a second CGL disposed between the second emitting unit 620 and the third emitting unit. In this case, at least one of the first emitting unit 520, the second emitting unit 620 and the third emitting unit may include an emitting material layer which includes at least one host H1 and first and second fluorescent materials DF1 and DF2, as described above.

Experimental Example 1: Evaluation of Energy Level of Compound

Energy levels such as HOMO energy levels, LUMO energy levels, excited singlet energy levels $S_1$ and excited triplet energy levels $T_1$ for mCBP as a host, the compounds 1-3 in Chemical Formula 4 as a first delayed fluorescent material, the compound M-1 in Chemical Formula 5, B3PyMPM as the HBL material and the reference compound (Ref) below, which is triazine-based delayed fluorescent material, were evaluated. Table 1 below indicates the evaluation results.

[Reference Compound]

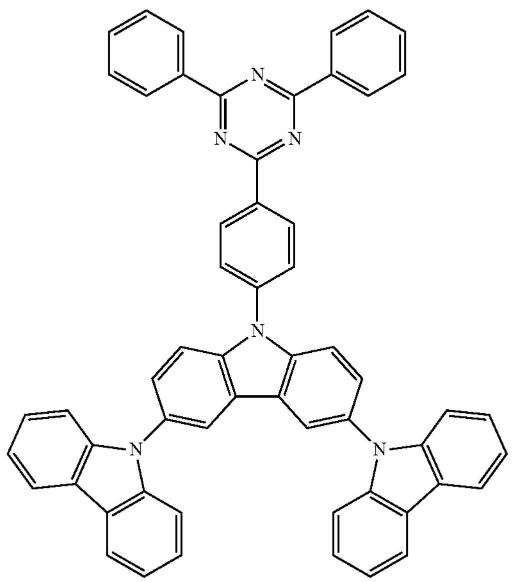 [SMILES: c1ccc(-c2nc(-c3ccccc3)nc(-c3ccc(-n4c5ccc(-n6c7ccccc7c7ccccc76)cc5c5cc(-n6c7ccccc7c7ccccc76)ccc54)cc3)n2)cc1]

TABLE 1

Energy Level of Compound

| | Compound | HOMO (eV) | LUMO (eV) | $S_1$ (eV) | $T_1$ (eV) |
|---|---|---|---|---|---|
| | Host (mCBP) | −5.9 | −2.4 | 3.2 | 2.9 |
| DF1 | Compound 1 | −5.9 | −3.3 | — | 2.4 |
| | Compound 2 | −5.9 | −3.2 | — | 2.4 |
| | Compound 3 | −5.9 | −3.2 | — | 2.3 |
| | Reference compound | −5.6 | −3.0 | — | 2.6 |
| DF2 | Compound M-1 | −5.9 | −3.0 | — | 2.6 |
| HBL | B3PYMPM | — | −2.7 | | |

HOMO: Film (100 nm/ITO), by AC3;
LUMO: calculated from film absorption edge;
$T_1$: Calculated by Gaussian ED-DFT(time-dependent density functional theory)

Example 1 (Ex. 1): Fabrication of OLED

An OLED comprising an EML into which mCBP as a host, Compound 1 as a first delayed fluorescent material and Compound M-1 as a second delayed fluorescent material was introduced was fabricated. ITO substrate was washed by UV-Ozone treatment before using, and was transferred to a vacuum chamber for depositing emission layer. Subsequently, an anode, an emission layer and a cathode were deposited by evaporation from a heating boat under $10^{-6}$ Torr vacuum condition as the following order:

An anode (ITO, 50 nm); a HIL (HAT-CN, 7 nm); a HTL (NPB, 18 nm); an EBL (TAPC, 15 nm), an EML (mCBP: Compound 1: Compound M-1=60:20:20 by weight ratio, 35 nm); a HBL (B3PYMPM, 10 nm); an ETL (TPBi, 25 nm), an EIL (LiF, 5 nm); and a cathode (Al, 100 nm).

And then, cappling layer (CPL) was deposited over the cathode and the device was encapsulated by glass. After deposition of emissive layer and the cathode, the OLED was transferred from the deposition chamber to a dry box for film formation, followed by encapsulation using UV-curable epoxy and moisture getter. The energy level relationships among the luminous materials in the EML and the HBL are as follows: $T_1^{DF2}-T_1^{TD1}$=0.2 eV; $LUMO^{DF2}$-$LUMO^{DF2}$=0.3 eV; and $LUMO^{HBL}$-$LUMO^{DF2}$=0.3 eV.

Examples 2-4 (Ex. 2~4): Fabrication of OLED

An OLED was fabricated using the same materials as Example 1, except adjusting the weight ratio of mCBP: Compound 1: Compound M-1 to 80:10:10 (Ex. 2), 40:30:30 (Ex. 3) and 20:40:40 (Ex. 4), respectively.

Comparative Example 1 (Ref. 1): Fabrication of OLED

An OLED having single delayed fluorescent material in the EML was fabricated using the same materials as Example 1, except adjusting the weight ratio of mCBP: Compound 1 to 60:40. The energy level relationship among the luminosus materials in the EML is as follows: $LUMO^{HBL}$-$LUMO^{DF}$=0.6 eV.

Comparative Example 2 (Ref. 2): Fabrication of OLED

An OLED having single delayed fluorescent material in the EML was fabricated using the same materials as Ref. 1, except applying the triazine-based reference compound instead of Compound 1 as a delayed fluorescent material in the EML. The energy level relationship among the luminosus materials in the EML is as follows: $LUMO^{HBL}$-$LUMO^{DF}$=0.3 eV.

Comparative Example 3 (Ref. 3): Fabrication of OLED

An OLED without the host in the EML was fabricated using the same materials as Example 1, except the weight ratio of the Compound 1 (first delayed fluorescent material): Compound M-1 (second delayed fluorescent material) to 60:40.

Comparative Example 4 (Ref. 4): Fabrication of OLED

An OLED was fabricated using the same materials as Example 1, except applying the triazine-based reference compound as the first delayed fluorescent material instead of the Compound 1. The energy level relationships among the luminosus materials in the EML and the HBL are as follows: $T_1^{DF2}-T_1^{TD1}$=0.2 eV; $LUMO^{DF2}$-$LUMO^{DF2}$=0 eV; and $LUMO^{HBL}$-$LUMO^{DF2}$=0.3 eV.

Comparative Example 5 (Ref. 5): Fabrication of OLED

An OLED was fabricated using the same materials as Example 1, except adjusting the weight ratio of mCBP: Compound 1: Compound M-1 to 30:20:50.

Example 5 (Ex. 5): Fabrication of OLED

An OLED was fabricated using the same materials as Example 1, except applying Compound 2 as the first delayed fluorescent material instead of the Compound 1. The energy level relationships among the luminosus materials in the EML and the HBL are as follows: $T_1^{DF2}-T_1^{TD1}$=0.2 eV; $LUMO^{DF2}$-$LUMO^{DF2}$=0.2 eV; and $LUMO^{HBL}$-$LUMO^{DF2}$=0.3 eV.

Example 6 (Ex. 6): Fabrication of OLED

An OLED was fabricated using the same materials as Example 1, except applying Compound 3 as the first delayed fluorescent material instead of the Compound 1. The energy level relationships among the luminosus materials in the EML and the HBL are as follows: $T_1^{DF2}-T_1^{TD1}$=0.3 eV; $LUMO^{DF2}$-$LUMO^{DF2}$=0.2 eV; and $LUMO^{HBL}$-$LUMO^{DF2}$=0.3 eV.

Experimental Example 2: Measurement of Luminous Properties of OLED

Figure 17:
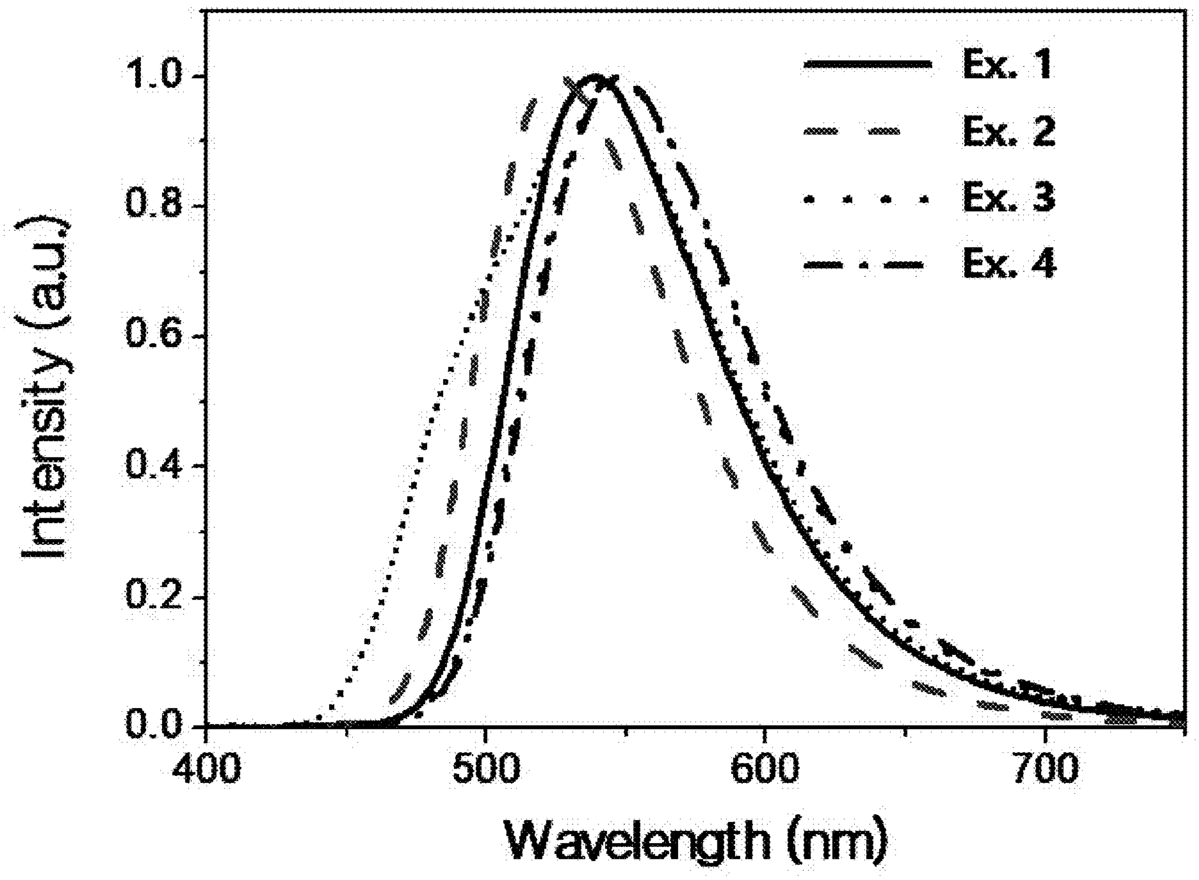
FIG. 17 is a graph illustrating electroluminescence (EL) spectra of OLEDs in accordance with Examples of the present disclosure.
Figure 18:
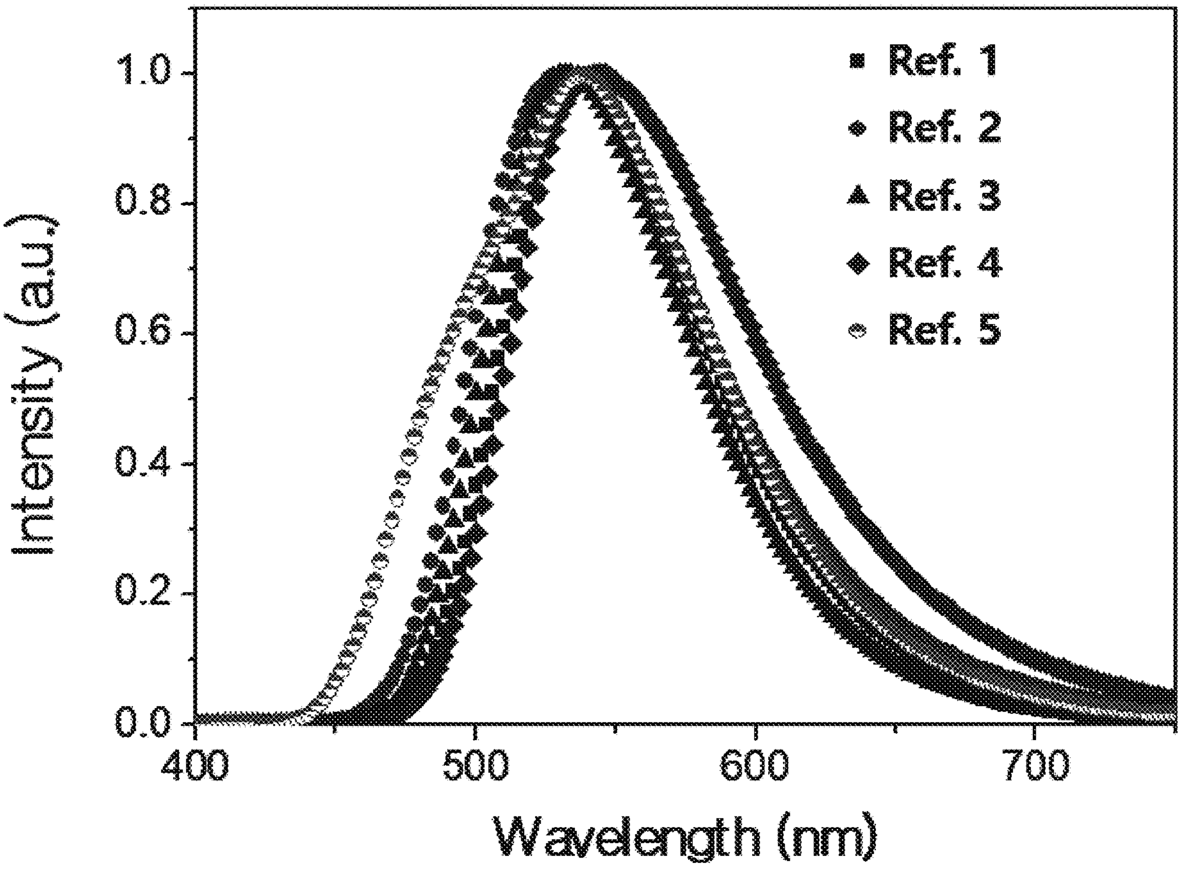
FIG. 18 is a graph illustrating EL spectra of OLEDs in accordance with Comparative Examples.

Each of the OLED fabricated by Examples 1 to 6 and Comparative Examples 1 to 5 was connected to an external power source and luminous properties for all the diodes were evaluated using a constant current source (KEITHLEY) and a photometer PR650 at room temperature. In particular, driving voltage (V), current efficiency (cd/A), power efficiency (lm/W), external quantum efficiency (EQE; %), luminance (cd/$m^2$), maximum electroluminescence (EL $\lambda_{max}$, nm), FWHM (nm) at a current density of 10 mA/$cm^2$ and a time period until luminescence is reduced to 95% level (lifetime, $T_{95}$) at a current density of 12.7 J (6.3 mA/$cm^2$) were measured. In addition, each of Electroluminescent (EL) peak intensities of the OLEDs was measured. The results thereof are shown in the following Table 2 and FIGS. 17 and 18.

TABLE 2

Luminous Properties of OLED

| | V | cd/A | lm/W | EQE (%) | cd/$m^2$ | EL $\lambda_{max}$ | FWHM | $T_{95}$(min.) |
|---|---|---|---|---|---|---|---|---|
| Ref. 1 | 4.3 | 59.5 | 44.2 | 17.3 | 3751 | 538 | 86 | 330 |
| Ref. 2 | 3.5 | 53.2 | 39.2 | 16.7 | 3351 | 526 | 98 | 70 |
| Ref. 3 | 4.7 | 54.3 | 36.2 | 15.9 | 3420 | 532 | 84 | 200 |
| Ref. 4 | 3.5 | 27.9 | 25.0 | 9.1 | 1759 | 544 | 102 | 125 |
| Ref. 5 | 3.4 | 53.5 | 49.2 | 15.6 | 3360 | 538 | 111 | 55 |
| Ex. 1 | 3.6 | 67.4 | 58.8 | 19.6 | 4247 | 536 | 85 | 420 |
| Ex. 2 | 3.8 | 65.1 | 53.8 | 18.8 | 4103 | 526 | 83 | 350 |
| Ex. 3 | 3.5 | 65.9 | 59.2 | 20.1 | 4155 | 548 | 90 | 450 |
| Ex. 4 | 3.4 | 69.5 | 64.1 | 20.6 | 4376 | 548 | 90 | 480 |
| Ex. 5 | 3.8 | 59.7 | 49.3 | 18.6 | 3763 | 530 | 82 | 300 |
| Ex. 6 | 3.9 | 56.7 | 45.7 | 19.0 | 3571 | 525 | 78 | 270 |

As indicated in Table 2, compared to the OLED applying single delayed fluorescent material in the EML of Ref 1, the OLED applying two delayed fluorescent materials having controlled energy levels and adjusting the concentrations of the delayed fluorescent materials of Examples lowered their driving voltages up to 20.9% and improved their current efficiency up to 16.8%, their power efficiency up to 45.0%, their EQE up to 19.1%, their luminance up to 16.7% and their luminous lifetime up to 45.5%, respectively.

Compared to the OLED applying the triazine-based reference compound as a single delayed fluorescent material in the EML of the Ref. 2, the OLEDs of the Examples showed equivalent driving voltage, but improved their current efficiency up to 30.6%, their power efficiency up to 63.5%, their EQE up to 23.4%, their luminance up to 30.6% and their luminous lifetime up to 5.86 times, respectively. Particularly, the luminous lifetime of the OLED of the Ref 2 was reduced significantly.

Compared to the OLED applying two delayed fluorescent materials without the host in the EML of Ref 3, the OLEDs of the Examples lowered their driving voltages up to 27.7% and improved their current efficiency up to 28.0%, their power efficiency up to 77.1%, their EQE up to 29.6%, their luminance up to 28.0% and their luminous lifetime up to 2.4 times, respectively. It is likely that when the EML includes only two delayed fluorescent materials without the host, the triplet energy level of the second delayed fluorescent material is not sufficiently high and the triplet confinement is deficient, so that holes cannot be injected and transferred into the EML efficiently, and therefore the luminous efficiency is reduced overall.

Compared to the OLED applying the triazine-based reference compound as a first delayed fluorescent material in the EML of the Ref. 4, the OLEDs of the Examples showed equivalent driving voltages, but improved their currency efficiency up to 149.1%, their power efficiency up to 156.4%, their EQE up to 126.4%, their luminance up to 148.2% and their luminous lifetime up to 2.84 times, respectively. The triazine-based reference compound as the first delayed fluorescent material has the same LUMO energy level as the Compound M-1 as the second delayed fluorescent material in the OLED of Ref. 4. Accordingly, an exciplex is formed between the triazine-based reference compound having a HOMO energy level shallower than that of the second delayed fluorescent material, and the second delayed fluorescent material having a LUMO energy level not higher than that of the reference compound, thereby reducing its luminous efficiency overall and also widening greatly its FWHM.

In addition, compared to the OLED in which the second delayed fluorescent material is excessively doped compared to the first delayed fluorescent material of Ref 5, the OLEDs of the Examples showed identical driving voltages, but improved their current efficiency up to 29.9%, their power efficiency up to 30.3%, their EQE up to 32.1%, their luminance up to 30.2% and their luminous lifetime up to 7.72 times, respectively. The excessively doped second delayed fluorescent material in Ref. 5 involves improvement of electron injection. But, as two delayed fluorescent materials light emit simultaneously in the luminescence process, the luminous efficiency, the luminous lifetime and the color purity are reduced.

On the other hand, the OLEDs of Examples are designed to have adequate triplet energy levels, LUMO energy levels and HOMO energy levels among the host, delayed fluorescent materials and HBL material. The second delayed fluorescent material improves electron injection and transfer properties of the first delayed fluorescent material without being involved substantially in luminescence. Accordingly, the luminous efficiency and the luminous lifetime of the OLEDs can be improved.

Example 7 (Ex. 7): Fabrication of OLED

Figure 19:
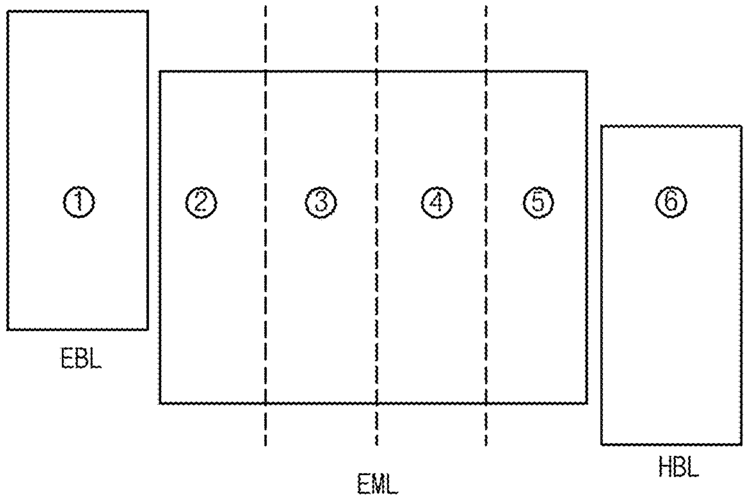
FIG. 19 is a schematic diagram illustrating six layers (areas) divided in the EML and adjacent exciton layers in accordance with Example of the present disclosure.

In order to confirm an exciton recombination area in the OLED, the EBL, the EML and the HBL were partitioned into six layers (six regions) as shown in FIG. 19 and were laminated sequentially. Only one of six layers is doped with red phosphorescent material at a concentration of 0.2% by weight, the other layers is not doped with the red phosphorescent material using the same material as Example 1, and finally six OLEDs were fabricated. The six layers (six regions) partitioned in the EBL, EML and HBL in order to confirm the exciton recombination area are as follows:

First layer (first region, EBL, 15 nm); second layer (second region, 0-9 nm region in the EML); third layer (third region, 9-18 nm in the EML); fourth area (fourth region, 18-27 nm in the EML); fifth layer (fifth region, 27-35 nm in the EML); and sixth layer (sixth region, HBL, 10 nm).

Comparative Example 6 (Ref. 6): Fabrication of OLED

In order to confirm an exciton recombination area in the OLED, the EBL, the EML and the HBL were partitioned into six layers (six regions) and were laminated sequentially as Example 7, adjusting the weight ratio mCBP: Compound 1 to 60:40 as Ref 1, and finally six OLEDs were fabricated.

Experimental Example 3: Measurement of Exciton Recombination Area

Emission intensity of the red light in each of the six layers was compared in the OLEDs fabricated in Ex. 7 and Ref 6. The red phosphorescent material doped in each layer absorbs the light emitted from the green phosphorescent material and the region where red emission occurs coincides with the exciton recombination area which is the region where green delayed fluorescent material actually emits.

Figure 20:
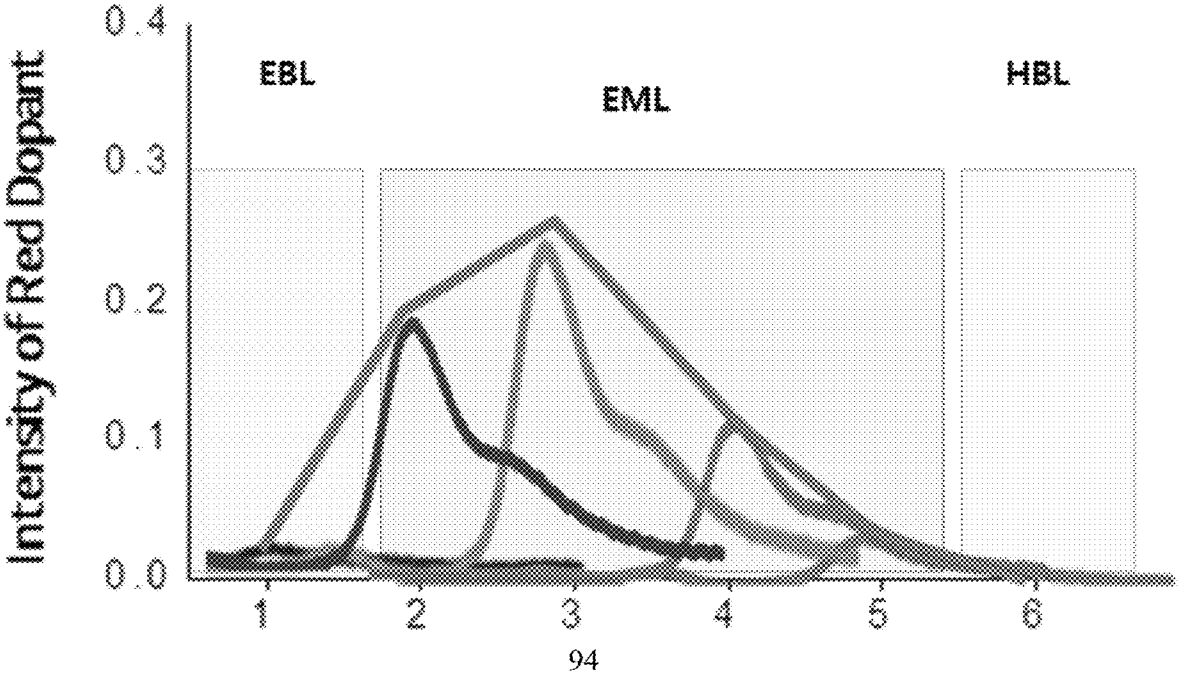
FIG. 20 is a graph illustrating measurement result of exciton recombination area in the OLED applying different delayed fluorescent materials in the EML in accordance with Example.
Figure 21:
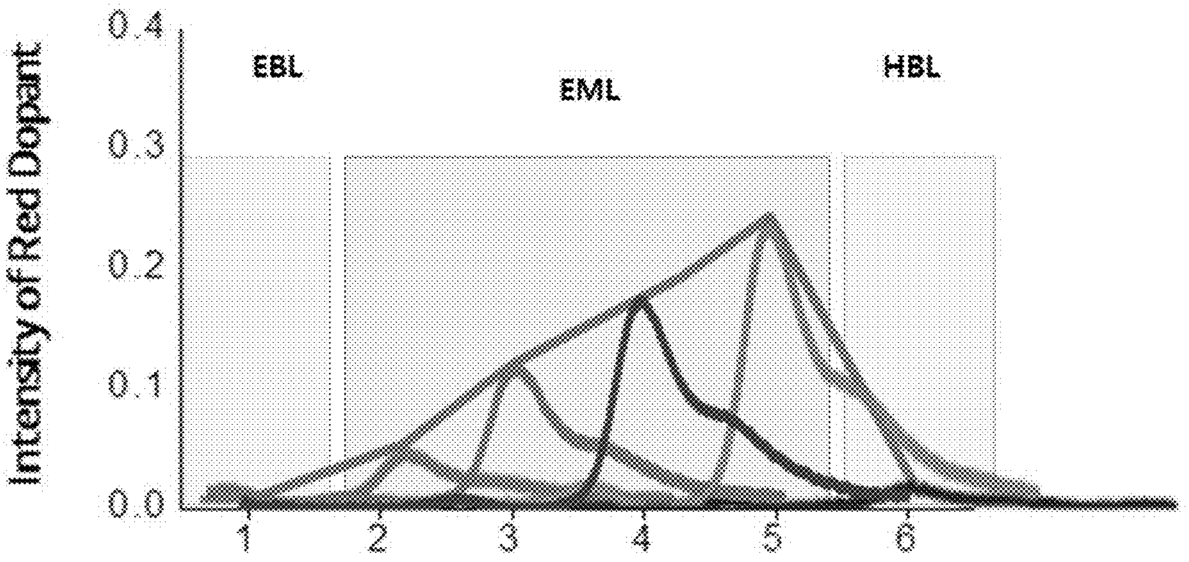
FIG. 21 is a graph illustrating measurement result of exciton recombination area in the OLED applying single delayed fluorescent material in the EML in accordance with Comparative Example.

As shown in FIG. 20, the exciton recombination area is slightly biased toward the EBL, but is formed around the central region of the EML in the OLEDs fabricated in Ex. 7. On the other hand, as shown in FIG. 21, the exciton recombination area is biased significantly toward the HBL in the OLEDs fabricated in Ref. 6. Since holes and electrons cannot be injected into the EML in a balanced manner, the OLED of Ref 1 seems to have limited luminous efficiency and the luminous lifetime.

While the present disclosure has been described with reference to exemplary aspects and examples, these aspects and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

What is claimed is:

1. An organic light emitting diode, comprising:

a first electrode;

a second electrode facing the first electrode; and at least one emitting unit disposed between the first electrode and the second electrode, wherein the at least one emitting unit comprises a first emitting material layer, wherein the first emitting material layer comprises a first host, a first delayed fluorescent material and a second delayed fluorescent material, wherein the first emitting material layer is doped with 30 wt % to 40 wt % of each of the first delayed fluorescent material and the second delayed fluorescent material, wherein the first delayed fluorescent material comprises an organic compound having the following structure of Chemical Formula 1, and the second delayed fluorescent material comprises an organic compound having the following structure of Chemical Formula 2:

[Chemical Formula 1]

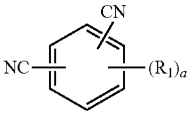

[Chemical Formula 2]

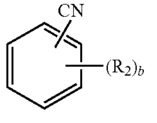

wherein each of $R_1$ and $R_2$ is independently selected from the group consisting of hydrogen, deuterium, $C_1$-$C_{20}$ alkyl, $C_6$-$C_{30}$ aryl, and hetero aryl selected from:

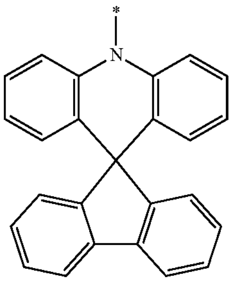

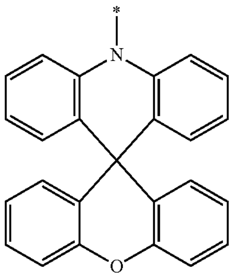

wherein asterisk indicates a site linked to the phenyl core, wherein the $C_6$-$C_{30}$ aryl, if present as at least one of $R_1$ and $R_2$, is unsubstituted or substituted with $C_1$-$C_{10}$ alkyl, wherein each of a and b is a number of substituent, a is an integer of 0 (zero) to 3 and b is an integer of 0 (zero) to 4, wherein an excited triplet energy level ($T_1^{DF1}$) of the first delayed fluorescent material and an excited triplet energy level ($T_1^{DF2}$) of the second delayed fluorescent material satisfy the following relationship in Equation (1), wherein a lowest unoccupied molecular orbital (LUMO) energy level ($LUMO^{DF1}$) of the first delayed fluorescent material and a LUMO energy level ($LUMO^{DF2}$) of the second delayed fluorescent material satisfy the following relationship in Equation (3), and wherein each of an excited singlet energy level ($S_1^{H}$) and an excited triplet energy level ($T_1^{H}$) of the first host is higher than each of an excited singlet energy level ($S_1^{DF1}$) and the excited triplet energy level ($T_1^{DF1}$) of the first delayed fluorescent material, respectively:

$$T_1^{DF2} > T_1^{DF1} \quad (1)$$

$$LUMO^{DF2} - LUMO^{DF1} \leq 0.3 \text{ eV} \quad (3).$$

2. The organic light emitting diode of claim 1, wherein the excited triplet energy level ($T_1^{DF1}$) of the first delayed fluorescent material and the excited triplet energy level ($T_1^{DF2}$) of the second delayed fluorescent material satisfy the following relationship in Equation (2), and wherein the LUMO energy level ($LUMO^{DF1}$) of the first delayed fluorescent material and the LUMO energy level ($LUMO^{DF2}$) of the second delayed fluorescent material satisfy the following relationship in Equation (4):

$$0.1 \text{ eV} \leq T_1^{DF2} - T_1^{DF1} \leq 0.4 \text{ eV} \quad (2)$$

$$0.1 \text{ eV} \leq LUMO^{DF2} - LUMO^{DF1} \leq 0.3 \text{ eV} \quad (4).$$

3. The organic light emitting diode of claim 1, wherein contents of the first delayed fluorescent material is more than contents of the second delayed fluorescent material in the first emitting material layer.

4. The organic light emitting diode of claim 1, wherein the at least one emitting unit further comprises at least one hole blocking layer disposed between the first electrode and the second electrode, and wherein the LUMO energy level ($LUMO^{DF2}$) of the second delayed fluorescent material and a LUMO energy level ($LUMO^{HBL}$) of the hole blocking layer satisfy the following relationship in Equation (5):

$$LUMO^{HBL} - LUMO^{DF2} \leq 0.3 \text{ eV} \quad (5).$$

5. The organic light emitting diode of claim 1, wherein at least one selected from $R_1$ and $R_2$ is phenyl or naphthyl.

6. The organic light emitting diode of claim 1, wherein the first emitting material layer further comprises a fluorescent material, and wherein each of the excited singlet energy level ($S_1^{DF1}$) of the first delayed fluorescent material and an excited singlet energy level ($S_1^{DF2}$) of the second delayed fluorescent material is higher than an excited singlet energy level ($S_1^{FD}$) of the fluorescent material.

7. The organic light emitting diode of claim 1, further comprises a second emitting material layer disposed between the first electrode and the first emitting material layer or disposed between the first emitting material layer and the second electrode, wherein the second emitting material layer comprises a second host and a first fluorescent material, and wherein each of the excited singlet energy level ($S_1^{DF1}$) of the first delayed fluorescent material and an excited singlet energy level ($S_1^{DF2}$) of the second delayed fluorescent material is higher than an excited singlet energy level ($S_1^{FD1}$) of the first fluorescent material.

8. The organic light emitting diode of claim 7, further comprises a third emitting material layer disposed opposite to the second emitting material layer with respect to the first emitting material layer, wherein the third emitting material layer comprises a third host and a second fluorescent material, and wherein each of the excited singlet energy level ($S_1^{DF1}$) of the first delayed fluorescent material and the excited singlet energy level ($S_1^{DF2}$) of the second delayed fluorescent material is higher than each of the excited singlet energy level ($S_1^{FD1}$) of the first fluorescent material and an excited singlet energy level ($S_1^{FD2}$) of the second fluorescent material.

9. The organic light emitting diode of claim 1, wherein the at least one emitting unit comprises a first emitting unit disposed between the first electrode and the second electrode and a second emitting unit disposed between the first emitting unit and the second electrode, wherein the first emitting unit comprises a lower emitting material layer and the second emitting unit comprises an upper emitting material layer, wherein at least one of the lower emitting material layer and the upper emitting material layer comprises the first emitting material layer, and further comprises a charge generation layer disposed between the first emitting unit and the second emitting unit.

10. The organic light emitting diode of claim 1, wherein at least one $R_2$ is the hetero aryl.

11. The organic light emitting diode of claim 1, wherein at least one of $R_1$ is

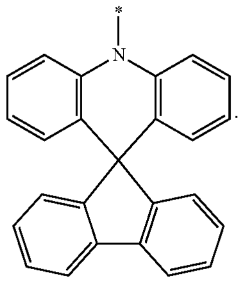 [SMILES: *N1c2ccccc2C2(c3ccccc3-c3ccccc32)c2ccccc21]

12. The organic light emitting diode of claim 1, wherein at least one of $R_1$ is

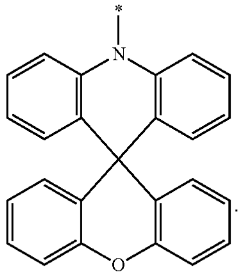 [SMILES: *N1c2ccccc2C2(c3ccccc3Oc3ccccc32)c2ccccc21]

13. The organic light emitting diode of claim 1, wherein at least one of $R_2$ is

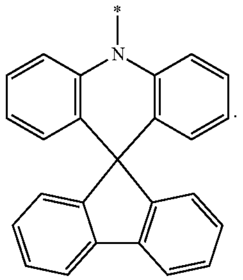 [SMILES: *N1c2ccccc2C2(c3ccccc3-c3ccccc32)c2ccccc21]

14. The organic light emitting diode of claim 1, wherein at least one of $R_2$ is

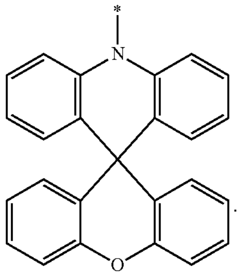 [SMILES: *N1c2ccccc2C2(c3ccccc3Oc3ccccc32)c2ccccc21]

* * * * *